(12) United States Patent
Deboy

(10) Patent No.: US 9,912,220 B2
(45) Date of Patent: Mar. 6, 2018

(54) PROTECTION FROM HARD COMMUTATION EVENTS AT POWER SWITCHES

(71) Applicant: Infineon Technologies Austria AG, Villach (AT)

(72) Inventor: Gerald Deboy, Klagenfurt (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/621,317

(22) Filed: Jun. 13, 2017

(65) Prior Publication Data

US 2017/0285674 A1 Oct. 5, 2017

Related U.S. Application Data

(63) Continuation of application No. 14/599,847, filed on Jan. 19, 2015.

(51) Int. Cl.
*H02M 1/08* (2006.01)
*G05F 1/56* (2006.01)
*H03K 17/0812* (2006.01)

(52) U.S. Cl.
CPC .............. *H02M 1/08* (2013.01); *H02M 1/083* (2013.01); *G05F 1/56* (2013.01); *H03K 17/08122* (2013.01)

(58) Field of Classification Search
CPC ........ H02M 1/08; H02M 1/083; H02M 1/088; H03K 17/08122; H03K 17/6871; G05F 1/56
See application file for complete search history.

(56) References Cited

U.S. PATENT DOCUMENTS

| 6,853,232 B2 | 2/2005 | Sander et al. |
| 7,141,957 B2 | 11/2006 | Tolle et al. |
| 7,196,916 B2 | 3/2007 | Batarseh et al. |
| 7,932,754 B1 | 4/2011 | Broach et al. |

(Continued)

FOREIGN PATENT DOCUMENTS

| CN | 101803164 A | 8/2010 |
| CN | 102387935 A | 3/2012 |

(Continued)

OTHER PUBLICATIONS

Notice of Allowance, in the Korean language, from counterpart Korean Application No. 10-2016-0005931, dated May 23, 2017, 2 pp.
Prosecution History from U.S. Appl. No. 14/599,847, dated from Jun. 20, 2016 through Apr. 12, 2017, 44 pp.

(Continued)

*Primary Examiner* — Gary L Laxton
*Assistant Examiner* — Kyle J Moody
(74) *Attorney, Agent, or Firm* — Shumaker & Sieffert, P.A.

(57) ABSTRACT

A system is described that includes a half-bridge, a first driver, a second driver, and a controller unit. The half-bridge includes a first switch coupled to a second switch at a switching node. The first driver is configured to drive the first switch and the second driver is configured to drive the second switch. The controller unit is configured to determine whether a hard commutation event is likely to occur at the half-bridge during a future switching cycle, and responsive to determining that the hard commutation event is likely to occur during the future switching cycle, control the first driver and the second driver to activate at least one hard commutation countermeasure.

18 Claims, 12 Drawing Sheets

(56) References Cited

U.S. PATENT DOCUMENTS

| | | |
|---|---|---|
| 8,730,700 B2 | 5/2014 | Yuzurihara et al. |
| 9,112,415 B2 | 8/2015 | Grakist et al. |
| 9,166,028 B2 | 10/2015 | Hirler et al. |
| 2004/0145922 A1 | 7/2004 | Jutras et al. |
| 2006/0220699 A1 | 10/2006 | Labbe |
| 2008/0278125 A1 | 11/2008 | Pigott |
| 2011/0187335 A1 | 8/2011 | Grakist et al. |
| 2012/0032633 A1 | 2/2012 | Cordes et al. |
| 2012/0049898 A1 | 3/2012 | Mauder et al. |
| 2012/0200273 A1 | 8/2012 | Eom et al. |
| 2013/0147523 A1 | 6/2013 | Deboy et al. |
| 2014/0002049 A1 | 1/2014 | Schrom et al. |
| 2014/0076044 A1 | 3/2014 | Otsuka et al. |
| 2014/0091852 A1 | 4/2014 | Norling et al. |
| 2014/0226375 A1 | 8/2014 | Feno |
| 2014/0369089 A1 | 12/2014 | Sakakibara |
| 2015/0349649 A1 | 12/2015 | Zane et al. |
| 2016/0181919 A1 | 6/2016 | Pavlovsky et al. |
| 2016/0209853 A1 | 7/2016 | Deboy |
| 2016/0209855 A1 | 7/2016 | Deboy |

FOREIGN PATENT DOCUMENTS

| | | |
|---|---|---|
| JP | 2003347550 A | 12/2003 |
| KR | 20110028958 A | 3/2011 |
| KR | 20140010978 A | 1/2014 |

OTHER PUBLICATIONS

Prosecution History from U.S. Appl. No. 14/599,823, dated Aug. 15, 2016 through Jun. 5, 2017, 42 pp.
Office Action, in Chinese, from counterpart Chinese Application No. 201610031865.3, dated Oct. 9, 2017, 8 pages.

PROTECTION FROM HARD COMMUTATION EVENTS AT POWER SWITCHES

RELATED APPLICATION

This application is a Continuation of U.S. application Ser. No. 14/599,847, filed Jan. 19, 2015, the entire content of which is hereby incorporated by reference.

TECHNICAL FIELD

The disclosure relates to techniques and circuits for controlling a power switch.

BACKGROUND

A metal-oxide-semiconductor field-effect transistor (MOSFET) is one example of a power switch that may be used to control the flow of current in a power circuit (e.g., a switch-mode power supply). During normal or regular switching operations of a power circuit, a MOSFET may suffer from abnormal operating conditions (e.g., high-voltage or high currents at the MOSFET) that can cause damage or otherwise disrupt the MOSFET. A hard commutation event is one type of abnormal operating condition that, due to "reverse recovery behavior" of the MOSFET, can cause damage to the MOSFET when the MOSFET is forced to block voltage while simultaneously carrying a positive forward current through the body diode of the MOSFET.

SUMMARY

In general, techniques and circuits are described for activating a countermeasure of a power circuit to protect a MOSFET from a hard commutation event. The power circuit operates according to a "passive" protection scheme and/or an "active" protection scheme.

While operating in a passive protection scheme, the power circuit momentarily activates a high-ohmic output of a driver of a MOSFET during at least a portion of each switching cycle in order to pull the gate terminal of the MOSFET to a low potential as a way to protect the MOSFET from any potential damage that could otherwise occur during a hard commutation event. During the remainder of each switching cycle (i.e., the portion of the switching cycle during when the high-ohmic output is not activated) the power circuit may instead, activate a low-ohmic output of the driver as a way to maintain efficiency. In some examples the high-ohmic output and the low-ohmic output of the driver may be a single output port, and in other examples, the two outputs may be multiple, individual output ports of the driver.

In an "active" protection scheme, the power circuit first predicts whether a hard commutation event will likely occur or not, during a future switching cycle, before taking any action to prevent, or at least protect the MOSFET from, hard commutation events. In response to determining that a hard commutation event is likely to occur, the power circuit may activate one or more countermeasures that protect a MOSFET from being damaged during an impending hard commutation event. Otherwise, in response to determining that a hard commutation event is not likely to occur, the power circuit refrains from activating the one or more countermeasures.

In one example, the disclosure is directed to a method including driving, with a driver, a power switch to supply power to a load for at least a switching cycle of the power switch. Driving the power switch includes enabling a high-ohmic output of the driver during at least one portion of a first phase of the switching cycle when the power switch is switched-off, and enabling a low-ohmic output of the driver during both a second phase of the switching cycle when the power switch is switched-on and during any remaining portion of the first phase other than the at least one portion of the first phase when the high-ohmic output is enabled. Ok with the clarification as added in the specification.

In another example, the disclosure is directed to a driver of a power switch used to supply power to a load for at least a switching cycle of the power switch. The driver includes at least one output. The at least one output includes a high-ohmic output that is enabled during at least one portion of a first phase of the switching cycle when the power switch is switched-off, and a low-ohmic output that is enabled during a second phase of the switching cycle when the power switch is switched-on and during any remaining portion of the first phase other than the at least one portion of the first phase when the high-ohmic output is enabled.

In another example, the disclosure is directed to a system that includes a half-bridge that includes a first switch coupled to a second switch at a switching node, a first driver configured to drive the first switch, and a second driver configured to drive the second switch. The second driver is configured to drive the second switch by at least: driving the second switch with a high-ohmic output of the second driver during at least one portion of a first phase of the switching cycle of the second switch when the second switch is switched-off, and driving the second switch on with a low-ohmic output of the second driver during a second phase of the switching cycle of the second switch when the second switch is switched-on and any remaining portion of the first phase of the switching cycle of the second switch other than the at least one portion of the first phase of the second switch.

In another example, the disclosure is directed to a method that includes during a current switching cycle of first and second power switches of a half-bridge of a resonant converter, determining whether a hard commutation event is likely to occur at the half-bridge during a future switching cycle of the first and second power switches. The method further includes responsive to determining that the hard commutation event is likely to occur during the future switching cycle, activating at least one hard commutation countermeasure, and responsive to determining that the hard commutation event will not occur during the future switching cycle, refraining from activating the at least one hard commutation countermeasure.

In another example, the disclosure is directed to a controller unit for a power circuit. The controller unit is configured to: during a current switching cycle of a half-bridge, determine whether a hard commutation event is likely to occur at the half-bridge during a future switching cycle, wherein the half-bridge includes a first switch coupled to a second switch at a switching node. The controller unit is further configured to: responsive to determining that the hard commutation event is likely to occur during the future switching cycle, control a first driver and a second driver to activate at least one hard commutation countermeasure, wherein the first driver drives the first switch and the second driver drives the second switch.

In another example, the disclosure is directed to a system that includes a half-bridge that includes a first switch coupled to a second switch at a switching node, a first driver configured to drive the first switch, a second driver configured to drive the second switch, and a controller unit. The controller unit is configured to: determine whether a hard commutation event is likely to occur at the half-bridge during a future switching cycle, and responsive to determining that the hard commutation event is likely to occur during the future switching cycle, control the first driver and the second driver to activate at least one hard commutation countermeasure.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
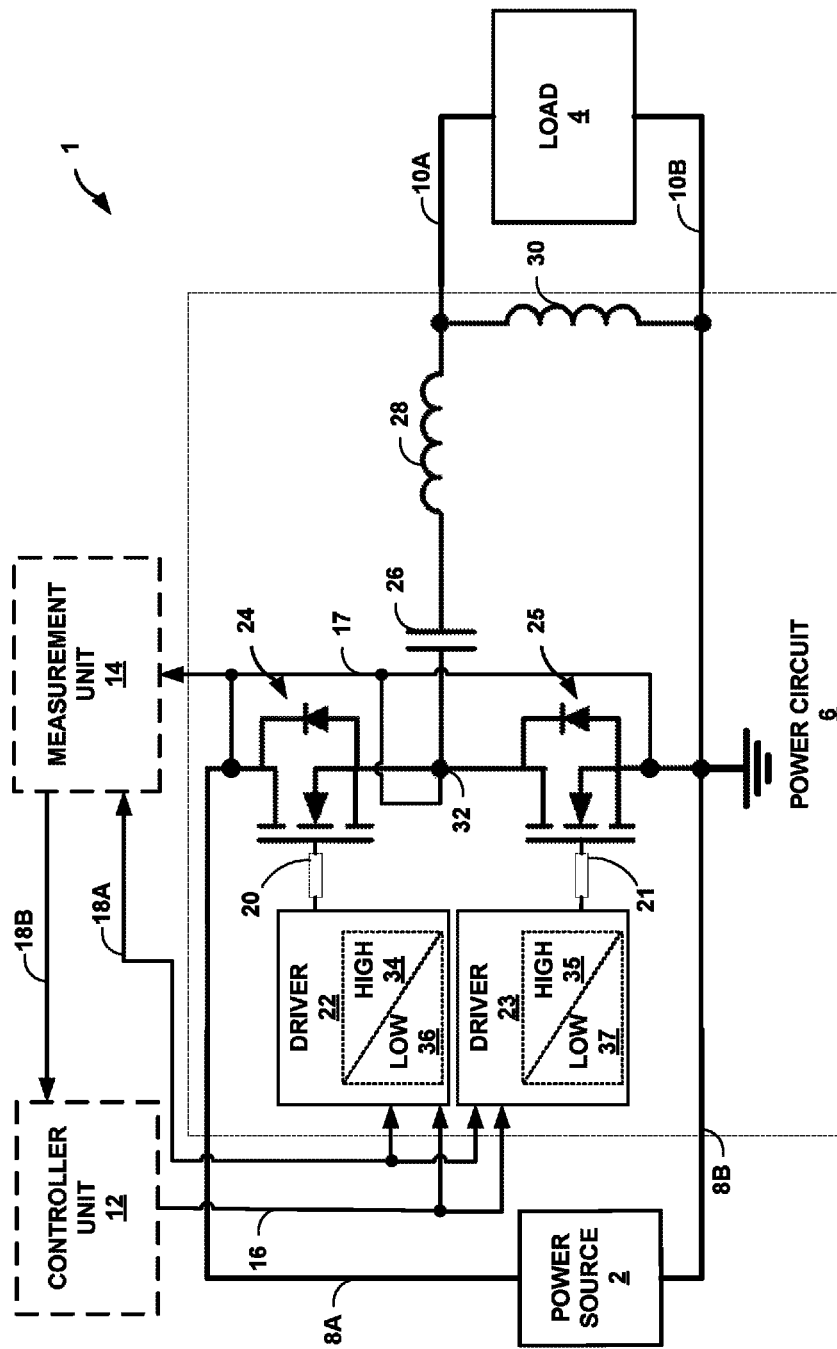
FIG. 1 is a block diagram illustrating an example system that includes a power circuit configured to protect a power switch from a hard commutation event, in accordance with one or more aspects of the present disclosure.

Some power circuits (e.g., a LLC converter, phase shift zero-voltage-switching converter, triangular current mode power factor correction stage converter, synchronous buck converter, and the like) include a half-bridge circuit. Half-bridge circuits typically include a high-side switch (e.g., a power MOSFET or other transistor based switch device that is configured to switch-on and switch-off via a gate signal) coupled to a low-side element at a switching node. The power circuit may modulate the high-side switch and/or the low side switch to control the transfer of energy from an input terminal (e.g., coupled to a source) to an output terminal (e.g., coupled to a load).

For example, consider a LLC converter which is configured to transfer energy from a source to a load. The LLC converter may rely on an LLC circuit and a half-bridge that includes a high-side MOSFET coupled, at a switching node which serves as an output of the half-bridge, to a low-side MOSFET. An input to the half-bridge may be coupled to the source and the output of the half-bridge may be coupled to the LLC circuit. The LLC circuit may be arranged between the switching node of the half-bridge and the load.

During normal or regular switching operations, a controller may modulate the high-side MOSFET and/or low-side MOSFET in such a way as to transfer energy from the source to the load. The controller may ensure that the high-side MOSFET and low-side MOSFET do not conduct through their respective forward conduction channels simultaneously. That is, whenever one of MOSFET of the half-bridge (i.e., either the high-side MOSFET or low-side MOSFET) is switched-on and conducting current through its forward conduction channel, the controller may ensure that the other MOSFET of the half-bridge remains switched-off (e.g., to block voltage). And prior to switching either MOSFET of the half-bridge on, the controller may ensure that the other MOSFET has been switched-off and is no longer conducting current through its forward conduction channel.

As used herein, the phrases "conduction channel" or "forward conduction channel" are used throughout this disclosure to refer to a forward channel of a MOSFET (e.g., a Metal-oxide-semiconductor structure forming a strong inversion layer in a p-well) and not a body diode of the MOSFET (e.g., formed by the PN junction of the MOSFET, such as between the drain and source of an N-channel MOSFET) that conducts when the MOSFET is in reverse operation mode. In addition, the terms first MOSFET and second MOSFET are used to designate one MOSFET of the half-bridge and not the other. In some examples, the first MOSFET may be the high-side MOSFET and the second MOSFET may be the low-side MOSFET, whereas in other examples, the first MOSFET may be the low-side MOSFET and the second MOSFET may be the high-side MOSFET.

The body diode of a first MOSFET of the half-bridge (i.e., either the high-side MOSFET or the low-side MOSFET) may be forward biased (this is the reverse operation mode) and conduct a positive, forward current while switched-on (e.g., switching-on at zero volt or zero-volt-switching). In normal or regular operation, the current will change its direction due to the characteristic of the resonant tank. That is the current flowing in reverse direction through the conducting channel (in parallel to the body diode) will change its direction and turn into a forward current through the conducting channel with the body diode now no longer conducting. Turning off the first MOSFET from this forward conducting state will cause a charging of the output capacitance of the first MOSFET and a discharging of the output capacitance of the second MOSFET. The voltage at the switching node hence changes until the voltage across the second MOSFET turns negative and the current is clamped by the conducting body diode of the second MOSFET (reverse operation mode of the second MOSFET). Now the second MOSFET can safely switch-on (also at zero volt). When the current through the second MOSFET has changed its polarity and the second MOSFET turns off, the voltage across the first MOSFET will fall as the current now discharges the output capacitance of the first MOSFET. Again the current will be clamped by the conducting body diode of the first MOSFET. The switching cycle begins anew.

During regular switching operations, MOSFETs can suffer from various abnormal operating conditions (e.g., high-voltages or high currents at the MOSFET) that over time can damage or otherwise disrupt the MOSFET. A hard commutation event is one type of abnormal operating condition that may occur when one MOSFET of a half-bridge is switched-on and begins conducting through its forward conduction channel while the other MOSFET of the half-bridge is still operating in reverse operation mode. If the second MOSFET is switched-on and begins conducting through its forward conduction channel while the first MOSFET is operating in reverse operation mode, a shoot through of the reverse recovery charge may occur in the conduction loop of the half-bridge which may result in a voltage overshoot occurring at the MOSFET previously being in reverse operation mode. When a voltage level overshoot occurs at a MOSFET, the overshoot may cause the MOSFET to operate in avalanche mode; over time, repeated exposure to overshoots may cause a MOSFET to degrade or destroy it.

Some power circuits may include various protections and perform various techniques to prevent MOSFETs from being damaged by voltage overshoots. A typical way that some power circuits survive hard commutation events is by relying on inherently more rugged MOSFETS. That is, a power circuit may include MOSFETs that withstand hard commutation events and the overshoots resulting thereof. However, for some power circuits, reliance on a MOSFET's inherent ruggedness may not be feasible. This is especially true for so-called superjunction structures where re-enforcing the device structure for hard commutation events would conflict with other optimization targets such as lowering the on-state resistance or lowering the fabrication cost of the device.

In some examples, power circuits may rely on additional "snubber circuitry" to ensure that a one or both MOSFETs of a half-bridge operate in such a way as to limit the potential for overshoots while complying with the de-rating requirements (e.g., the requirement to operate at some threshold amount of power that is less than a maximum capability in order to promote longevity) of the power circuit. This additional snubber circuitry can increase the size, complexity, or cost of the power circuit.

Another way that a power circuit may reduce its exposure to hard commutation events is by performing "life-time killing" techniques to reduce the amount of reverse recovery charge that needs to be removed from a MOSFET during a hard commutation event (this will e.g., reduce the reverse recovery current peak). However, a reduction in the reverse recovery charge may not address the current fall rate and/or voltage rise rate after the reverse recover current peak. In addition, this technique may introduce complexity of fabrication processes, increase cost, and/or reduce the on-state resistance of a given device.

Some power circuits may rely on super junction MOSFETs that use a relatively thick buffer layer below the p-columns as another way to prevent damage from hard commutation event. When used as a power MOSFET, the thick buffer layer of a Superjunction MOSFET may allow an expansion of the space charge layer after the depletion of the p-columns and the n-columns in the MOSFET, and may increase the softness of the body diode commutation. However, the relatively thick buffer layer may detrimentally cause a reduction in the on-state resistance ($R_{DSON}$) of the MOSFET and/or increase the cost of the MOSFET.

Finally, some power circuits may prevent damage from hard commutation events by using permanent gate resistors being integrated or externally arranged between the driver output and the gate of the MOSFET as a way to prevent hard commutation events from occurring. A gate resistor may enable a MOSFET that is undergoing a hard commutation, to trigger the switch-on of its forward conduction channel (dv/dt triggered re-turn on) in response to a high rate of change to the voltage (e.g., dv/dt) at its drain electrode as a way to survive the hard commutation. This technique may be effective in limiting the peak voltage associated with a hard commutation event at a MOSFET and may allow the MOSFET to survive critical conditions, however, this technique may prevent the MOSFET from performing hard and fast switch-off operations, and as a result, reduce its overall efficiency.

In general, techniques and circuits are described for enabling a power circuit to use a "passive" protection scheme alone or in combination with an "active" protection scheme to protect a half-bridge from hard commutation events. The passive protection scheme is a non-predictive way to protect a MOSFET from hard commutations. When operating according to the passive protection scheme, an example power circuit configures a driver to protect a corresponding MOSFET based entirely on the operating state of the MOSFET and regardless of whether a hard commutation is occurring, or is likely to occur at the half-bridge. In other words, rather than predict whether a hard commutation is likely to occur at a MOSFET, the power circuit simply enables a high-ohmic output (also referred to herein as a high-ohmic state) of a driver during at least a portion of each switching cycle when the MOSFET is switched-off (i.e., not conducting via its forward conduction channel). Conversely, the power circuit enables a low-ohmic output (also referred to herein as a low-ohmic state) of the driver during the remainder of the switching cycle (i.e., the portion of the switching cycle during when the high-ohmic output is not enabled). In this way, the high-ohmic output of the driver protects the corresponding MOSFET from potential voltage overshoots that may occur as a result of hard commutation events and the low-ohmic output of the driver allows the MOSFET to perform efficient (e.g., hard and fast) switching operations. In some examples the high-ohmic output and the low-ohmic output may be a single output port or individual output ports of the driver.

A high ohmic output may be created by using a high impedance driving stage of the driver or by adding a high ohmic resistor coupled in-between the gate driver and the MOSFET. A low ohmic output of the driver may be created by using a low ohmic impedance of the driver in combination with a low ohmic or no gate resistor coupled in-between the gate driver and the MOSFET. The terms "high ohmic output of the driver" and "low ohmic output of the driver" as used throughout this specification and in the claims is hence to be understood as the characteristic of the entire gate current path between a controller unit 12 and the MOSFET including the driver, gate resistor and further driving stages such as discrete boost circuits. The "high ohmic output" may be created by one or more of the elements of these lumped elements, e.g., using a driver stage with high internal resistance and/or relatively small current capability, or by adding further resistive elements in the gate current path such as high ohmic gate resistors, high ohmic or no boost stage, etc. Similarly a low ohmic output refers to a low ohmic characteristic of the entire gate current path, hence including strong driver stages with low internal resistance and/or high current capabilities, low or no gate resistors and/or a strong boost circuit with low internal resistance and/or high current capability.

Unlike the passive protection scheme, the active protection scheme described herein provides a way for a power circuit to first predict whether a hard commutation event is likely to occur before causing the power circuit to take action to prevent the hard commutation or otherwise protect the power circuit. When operating according to the active protection scheme, an example power circuit first determines whether a hard commutation event is likely to occur in the near future. If a hard commutation is likely to occur, the power circuit activates one or more countermeasures to protect the MOSFET from the impending hard commutation event. For example, the power circuit may determine whether a hard commutation event is likely to occur based at least in part on the voltage levels and/or current levels at different portions of the half-bridge that indicate whether one MOSFET of the half-bridge is "conducting on its body diode" while the other MOSFET is, or is about to be, switched-on. Otherwise, if the power circuit determines that a hard commutation event is not likely to occur, then the power circuit may refrain from activating any of the one or more countermeasures. As used herein, the phrase "conducting on its body diode" refers to the situation when a body diode of a respective MOSFET is conducting.

In this way, the techniques and circuits described herein provide various simple and low-cost ways to prevent, or at least protect, a half-bridge from hard commutation events. Whether enabling a power circuit to operate according to a passive and/or an active protection scheme, the described techniques may enable a power circuit to protect a half-bridge from hard commutation events more cheaply, and more simply, than other types of circuits that rely on snubber circuitry and/or more expensive and rugged MOSFETS.

The following techniques and circuits described herein present several ways to both detect whether a hard commutation event may occur as well as several ways to protect a half-bridge from a potential, hard commutation event. The passive and active techniques described herein can be used in any permutation, and in any combination, to prevent damage from occurring at a half-bridge as a result of hard commutations.

FIG. 1 is a block diagram illustrating an example of a system that includes a power circuit configured to protect a power switch from a hard commutation event, in accordance with one or more aspects of the present disclosure. In the example of FIG. 1, system 1 includes power source 2, power circuit 6, load 4, optional controller unit 12, and optional measurement unit 14. In some examples, system 1 may include additional or fewer components and provide the functionality of system 1 as described herein.

Power source 2 provides electrical energy in the form of power to system 1. Numerous examples of power source 2 exist and may include, but are not limited to, AC/DC converters, power grids, generators, power transformers, batteries, solar panels, windmills, degenerative braking systems, hydro electrical generators, or any other form of electrical power devices capable of providing electrical power to system 1. Although not specifically shown in FIG. 1, power source 2 includes an internal capacitor bank. Alternatively, in some examples, an input capacitor may be arranged in parallel to power source 2.

Load 4 receives the electrical power (e.g., voltage, current, etc.) provided by power source 2 and converted by power circuit 6. Numerous examples of load 4 exist and may include, but are not limited to, computing devices and related components, such as microprocessors, electrical components, circuits, laptop computers, desktop computers, tablet computers, mobile phones, batteries, speakers, lighting units, automotive/marine/aerospace/railway related components, motors, transformers, or any other type of electrical device and/or circuitry that receives a voltage or a current from a power converter.

Measurement unit 14 is optional and may be an individual component of system 1 or the functionality of measurement unit 14 may be dispersed across one or more of the other components of system 1 (e.g., controller unit 12, drivers 22 and 23, etc.). Measurement unit 14 may analyze system 1 to determine various electrical characteristics (e.g., voltage levels, current levels, etc.) and operating states of the components and nodes of system 1. For example, measurement unit 14 may determine a voltage level, a current level, and/or a direction (i.e., polarity) of current at one or more components and/or nodes of power circuit 6. Measurement unit 14 may obtain information about system 1 from link 17 and output information about the various electrical characteristics and operating states of the components and nodes of system 1 at links 18A and 18B.

In some examples, measurement unit 14 may include current sensors in the path of the current (e.g., placed between switching node 32 and power switch 24 and/or switching node 32 and power switch 25). In some examples, power switches 24 and 25 may each include respective current mirrors from which measurement unit 14 can sense the level and direction of current flowing through power switches 24 and 25. Measurement unit 14 may provide an indication of the level and/or direction of current flowing through power switches 24 and 25 over link 18B to controller unit 12, from which controller unit 12 may, as is described below, determine whether one of power switches 24 and 25 is in reverse operation mode and conducting on its body diode while the opposite one of power switches 24 and 25 is about to switch on.

Measurement unit 14 may include any suitable arrangement of hardware, software, firmware, or any combination thereof, to perform the techniques attributed to measurement unit 14. For example, measurement unit 14 may include any one or more microprocessors, digital signal processors (DSPs), application specific integrated circuits (ASICs), field programmable gate arrays (FPGAs), or any other equivalent integrated or discrete logic circuitry, as well as any combinations of such components. When measurement unit 14 includes software or firmware, measurement unit 14 further includes any necessary hardware for storing and executing the software or firmware, such as one or more processors or processing units. In general, a processing unit may include one or more microprocessors, DSPs, ASICs, FPGAs, or any other equivalent integrated or discrete logic circuitry, as well as any combinations of such components.

Controller unit 12 may generally control the components of power circuit 6 to control the flow of power between source 2 and load 4. Controller unit 12 is also optional and may be an individual component of system 1 or the functionality of controller unit 12 may be dispersed across one or more of the other components of system 1 (e.g., drivers 22 and 23, etc.). Controller unit 12 may comprise any suitable arrangement of hardware, software, firmware, or any combination thereof, to perform the techniques attributed to controller unit 12 herein. Controller unit 12 may be coupled to power circuit 6 via link 16 to send and/or receive signals or commands to power circuit 6 for controlling the operations of power circuit 6. In some examples, controller unit 12 may also be coupled to measurement unit 14 via link 18B to receive information that indicates the various electrical characteristics (e.g., voltage levels, current levels, etc.) and operating states of the components and nodes of system 1. Controller unit 12 may include any one or more microprocessors, digital signal processors (DSPs), application specific integrated circuits (ASICs), field programmable gate arrays (FPGAs), or any other equivalent integrated or discrete logic circuitry, as well as any combinations of such components. When controller unit 12 includes software or firmware, controller unit 12 further includes any necessary hardware for storing and executing the software or firmware, such as one or more processors or processing units. In general, a processing unit may include one or more microprocessors, DSPs, ASICs, FPGAs, or any other equivalent integrated or discrete logic circuitry, as well as any combinations of such components.

Each of links 8A, 8B, 10A, 10B, 16, 17, 18A, and 18B (collectively "links 8-18") represent any wired or wireless medium capable of conducting electrical power or electrical signals from one location to another. Examples of links 8-18 include, but are not limited to, physical and/or wireless electrical transmission mediums such as electrical wires, electrical traces, conductive gas tubes, twisted wire pairs, and the like.

Power circuit 6 is responsible for converting the electrical energy provided by power source 2 into a different, usable form of electrical energy for powering load 4. Power circuit 6 includes a half-bridge arrangement of power switches 24 and 25, drivers 22 and 23, gate resistors 21 and 22, and an LLC circuit made up of inductor 30 and a resonant tank that is made up of capacitor 26 and inductor 28.

In the example of FIG. 1, power circuit 6 is configured to operate as a LLC power converter that converts an input voltage provided by power source 2 at link 8A into an output voltage for load 4 at links 10A and 10B. The LLC circuit of power circuit 6 controls the impedance of a resonant tank by varying the frequency of its excitation. The techniques described are applicable to other types of power converters or power circuit, such as phase shift zero-voltage-switching converter, triangular current mode power factor correction stage converter, synchronous buck/boost converter, step-up converter, step-down converter, and the like, that include one or more power switches which, during operation, are susceptible to hard commutation events. In some examples, power circuit 6 may include additional or fewer elements than those shown in FIG. 1. For example, additional or different types of filters or gate resistors may be used. In some examples driver 22 and power switch 24 and/or driver 23 and power switch 25 may be integrated into the same package or semiconductor die or may be integrated into separate packages or onto separate semiconductor dies.

Power switches 24 and 25 and power source 2 combine to form the commutation loop associated with system 1. The commutation loop of power system 1 is a current path that is formed by the capacitance associated with power source 2 (e.g., a DC link capacitor), link 8A, the forward conduction channels of power switches 24 and 25, and link 8B.

Power switches 24 and 25 are arranged in a half-bridge configuration about switching node 32. Power switch 24 is a high-side switch and power switch 25 is a low-side switch. By controlling (e.g., modulating) power switches 24 and 25, controller unit 12 may vary the voltage or current at switching node 32 and as a result, vary the amount of energy being transferred from source 2 to load 4. For example, controller unit 12 may control power switches 24 and 25 according to frequency modulation, pulse-width modulation (PWM) techniques, pulse-depth modulation (PDW) techniques, pulse-amplitude modulation (PAM) techniques, pulse-position modulation (PPM) techniques, pulse-frequency modulation (PFM) techniques, and the like to control the voltage at switching node 32 and vary the resulting level of current and level of voltage being output from the LLC circuit of power circuit 6 at links 10A and 10B.

Power switches 24 and 25 each represent power MOSFETs having built-in body diodes between drain and source terminals of the power MOSFETs. In some examples, power switch 24 may represent a low voltage MOSFET with field plate structures. In some examples, power switch 24 may also represent a Superjunction device (e.g., a MOSFET or power MOSFET with a thick drift region that is heavily doped, thereby reducing the electrical resistance to electron flow, and another region that is heavily doped with the opposite carrier polarity, which effectively cancels out their fixed charge and develops a "depleted region") that supports the high voltage during the off-state (e.g., high breakdown voltage).

Gate resistor 20 is arranged between the output of driver 22 and the gate terminal of power switch 24. Gate resistor 21 is arranged between the output of driver 23 and the gate terminal of power switch 25. Driver 22 may receive a driver control signal via link 16 from controller unit 12 and based on the driver control signal, driver 22 drives the gate signal of power switch 24 to cause power switch 24 to switch-on or to switch-off. Driver 22 outputs the gate signal for power switch 24 via either high-ohmic output 34 or low-ohmic output 36. Driver 23 may receive a driver control signal via link 16 from controller unit 12 and based on the driver control signal, driver 23 drives the gate signal of power switch 25 to cause power switch 25 to switch-on or to switch-off. Driver 23 outputs the gate signal for power switch 25 via either high-ohmic output 35 or low-ohmic output 37.

Although illustrated as separate "outputs" of drivers 22 and 23, the respective high-ohmic outputs 34 and 35 and low-ohmic outputs 36 and 37 may be a single respective output port of drivers 22 and 23 or may be individual respective output ports of drivers 22 and 23. In other words, driver 22 may comprise a single output port coupled to the gate terminal of power switch 24 via gate resistor 20. The single output port of driver 22 may comprise both high-ohmic output 34 and low-ohmic output 36. Conversely, driver 22 may comprise dual output ports, with each being coupled to the gate terminal of power switch 24. A first output port of driver 22 may comprises high-ohmic output 34 and a second output port may comprise low-ohmic output 36.

In some examples, driver 22 may enable high-ohmic output 34 by causing an increase in the resistance associated with gate resistor 20 and conversely, may decrease the resistance associated with gate resistor 20 to enable low-ohmic output 36. Driver 23 may enable high-ohmic output 35 by causing an increase in the resistance associated with gate resistor 21 and conversely, may decrease the resistance associated with gate resistor 21 to enable low-ohmic output 37.

In some examples, according to the techniques and circuit described herein, drivers 22 and 23 may enable the respective high-ohmic output 34 and 35 or respective low-ohmic output 36 and 37 based on information obtained from controller unit 12 and/or measurement unit 14. For example, driver 22 may receive via link 16 from controller unit 12 an output impedance signal that commands driver 22 to enable high-ohmic output 24 or low-ohmic output 26. In addition, driver 22 may receive information about the voltage levels and current levels at the commutation loop from measurement unit 14 that indicate to driver 22 whether driver 22 should enable high-ohmic output 24 or low-ohmic output 26.

In some examples, drivers 22 and 23 may enable the respective high-ohmic output 34 and 35 or respective low-ohmic output 36 and 37 based on determinations made by drivers 22 and 23 about the operating states of switches 24 and 25. For example, driver 22 may enable high-ohmic output 34 during at least one portion of a first phase of a switching cycle when power switch 24 is switched-off and may enable low-ohmic output 36 during a second phase of the switching cycle when power switch 24 is switched-on and during any remaining portion of the first phase other than the at least one portion of the first phase when high-ohmic output 34 is enabled. Said differently, during a switching cycle, driver 22 may cause power switch 24 to switch-off first with low-ohmic output 36 enabled (e.g., to realize the best efficiency possible) and second, after a short delay time (e.g., 500 ns), driver 22 may cause power switch 24 to complete switching-off with high-ohmic output 34 enabled (e.g., as protection from hard commutations). Driver 22 may keep high-ohmic output 34 enabled until driver 22 causes power switch 24 to switch back on (e.g., as further protection from hard commutations). At the point in the switching cycle when driver 22 causes power switch 24 to switch back on, driver 22 may enable low-ohmic output 36 again (e.g., to realize improved efficiency) and keep low-ohmic output 36 enabled for the remainder of the switching cycle.

When high-ohmic outputs 34 and 35 are enabled, drivers 22 and 23 will switch-on power switches 24 and 25 more slowly or switch-off power switches 24 and 25 more slowly by coupling the respective gate terminals of power switched 24 and 25 in a high-ohmic way to pull the respective gate terminals to a low potential of the driver. Conversely, when low-ohmic outputs 36 and 37 are enabled, drivers 22 and 23 can switch-on and switch-off power switches 24 and 25 more quickly (i.e., with a gate signal that has shorter delay times and a higher voltage rate of change (e.g., dv/dt)).

In accordance with techniques of this disclosure, controller unit 12, driver 22, and driver 23 may, alone or in any combination, enable and disable outputs 34-37 in various ways to implement a passive and/or an active protection scheme for protecting power switches 24 and 25 from hard commutation events. Details of the passive and active protection schemes and the different ways that controller unit 12 and drivers 22 and 23 may control outputs 34-37 are described below with respect to the additional FIGS.

For example, while implementing a passive protection scheme, controller unit 12 may configure driver 22 to use high-ohmic output 34 whenever driver 22 causes power switch 24 to operate in a switched-on state and to use low-ohmic output 36 whenever driver 22 causes power switch 24 to operate in a switched-off state. Likewise, controller unit 12 may configure driver 23 to use high-ohmic output 35 or low-ohmic output 37 depending on whether driver 22 causes power switch 24 to operate in a switched-off or switched-on state.

While implementing an active protection scheme, controller unit 12 may first determine whether a hard commutation event is likely to occur during a subsequent switching cycle, and if so, activate one or more countermeasures that prevent, or at least protect power switches 24 and 25 from being damaged by, the impending hard commutation event. For example, upon determining that power switch 25 is still operating "in reverse operation mode" when power switch 24 is about to switch-on, controller unit 12 may cause driver 23 to enable high-ohmic output 35 to protect power switch 24 from being damaged by an impending hard commutation event that is likely to occur as result. In some examples, upon determining that power switch 25 is still operating in reverse operation mode conducting on its body diode when power switch 24 is switching-on, controller unit 12 may cause driver 22 to switch-on power switch 24 more slowly (e.g., by enabling high-ohmic output 34) in an attempt to limit the voltage overshoot caused by the hard commutation event. In some examples, upon determining that power switch 25 is still operating in reverse operation mode conducting on its body diode when power switch 24 is due to switch-on, controller unit 12 may cause driver 22 to delay switching-on power switch 24 and maintain power switch 24 in a switched-off state, in an attempt to prevent a hard commutation event from occurring by allowing power switch 25 more time to recombine its reverse recovery charge. In some examples, upon determining that power switch 25 is still operating in reverse operation mode conducting on its body diode when power switch 24 is due to switch-on, controller unit 12 may cause driver 22 to delay switching-on power switch 24 and maintain power switch 24 in a switched-off state while also briefly switching-on power switch 25, in an attempt to prevent a hard commutation event from occurring.

Figure 2:
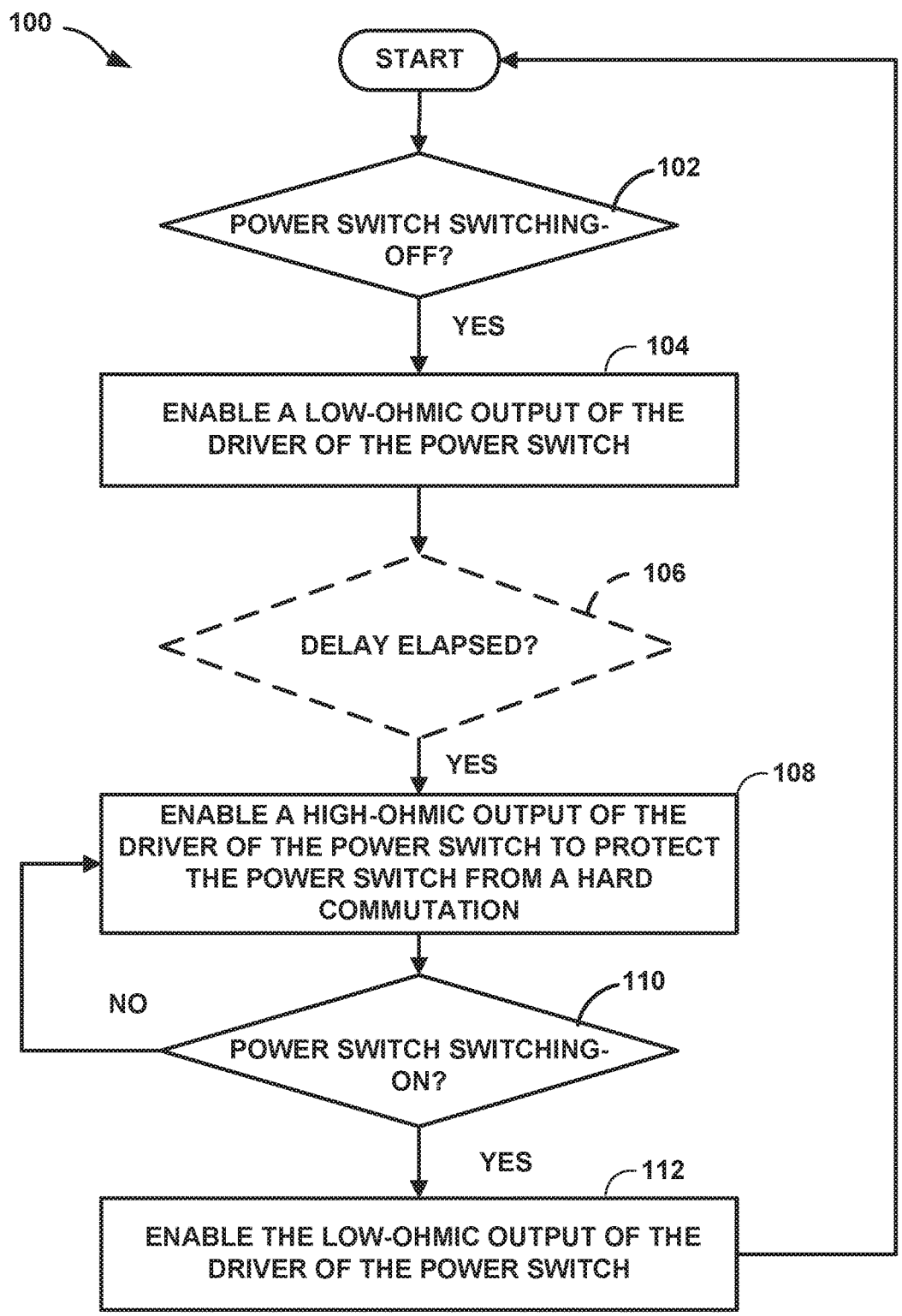
FIG. 2 is a flowchart illustrating operations of an example passive protection scheme for protecting a power switch from hard commutation events, in accordance with one or more aspects of the present disclosure.

FIG. 2 is a flowchart illustrating operations 100 of an example passive protection scheme for protecting power switches 24 and 25 from a hard commutation event at power switches 24 and 25, in accordance with one or more aspects of the present disclosure. FIG. 2 is described within the context of FIG. 1. For ease of description, operations 100 are primarily described as being performed by controller unit 12. However, in some examples, operations 100 may be performed by either of drivers 22 and 23, alone or in combination with controller unit 12.

Operations 100 represent a non-predictive way that system 1 may protect power switches 24 and 25 from hard commutation events. Operations 100 do not rely on a determination as to whether a hard commutation may or may not occur. Instead, to protect power switches 24 and 25 from hard commutations, operations 100 may be performed by system 1 to protect power switches 24 and 25 from hard commutation events by configuring driver 22 according to the current operating state of power switch 24 and by configuring driver 23 according to the current operating state of power switch 25. For the sake of brevity, the following example describes operations 100 being performed by controller unit 12 during a switching cycle when power switch 25 happens to be switching-off and power switch 24 happens to be switching-on however the same operations 100 apply similarly to situations when power switch 24 happens to be switching-off and power switch 25 happens to be switching-on.

In the example of FIG. 2, controller unit 12 operates according to a passive protection scheme to protect power switches 24 and 25 from hard commutation events by first determining whether either of power switches 24 or 25 of power circuit 6 is switching-off (102). For example, controller unit 12 control power circuit 6 according to modulation techniques to transfer energy from source 2 to load 4. During a switching cycle of power switches 24 and 25, controller unit 12 may cause power switch 24 to operate in a switched-off state while also causing power switch 25 to operate in a switched-on state. At the end of the switching cycle, and at the start of a next switching cycle, controller unit 12 may cause power switch 24 to operate in a switched-on state after first causing power switch 25 to switch-off.

Responsive to determining that power switch 25 is switching-off (102) controller unit 12 may ensure that power switch 25 switches-off with an increased amount of efficiency by causing power switch 25 to switch-off, at least initially, with a low amount of output impedance. Controller unit 12 may output a control signal via link 16 that enables low-ohmic output 37 of driver 23 (104) towards the end or after switching-off switch 25.

While power switch 25 is still switching-off, controller unit 12 may cause power switch 25 to finish switching-off with a high amount of output impedance to protect power switch 25 from a hard commutation event that may occur during or after switch-off. In other words, controller unit 12 may output a control signal via link 16 that enables high-ohmic output 35 of driver 23 (108) before power switch 25 finishes switching-off. Controller unit 12 may configure driver 23 to continue to rely on high-ohmic output 35 while power switch 25 remains switched-off to further protect power switch 25 from hard commutation events.

When high-ohmic output 35 is enabled, the gate of power switch 25 may be coupled, in a relatively high-ohmic way, to the ground of driver 23. Accordingly, if a hard commutation of the body diode of power switch 25 occurs, power switch 25 may switch-on its forward conduction channel in response to a voltage change (dv/dt) triggered switch-on through the intrinsic reverse capacitance of power switch 25. In this way, by enabling high-ohmic output 35 to induce the automatic switch-on of power switch 25, the passive protection scheme described herein is similar to some other types of protection schemes that use integrated gate resistors, but avoids the efficiency disadvantage caused by these other types of protection schemes that occur during normal operation.

In some examples, controller unit 12 may cause driver 23 to enable high-ohmic output 35 after a fixed or programmable delay after power switch 25 begins to switch-off (106). In other words, controller unit 12 may cause driver 23 to enable high-ohmic output 35 during at least one portion of a first phase of the switching cycle when power switch 25 is switched-off, and may cause driver 23 to enable low-ohmic output 37 during both a second phase of the switching cycle when power switch 25 is switched-on and during any remaining portion of the first phase other than the at least one portion of the first phase when high-ohmic output 37 is enabled.

Lastly, at the end of the switching cycle, controller unit 12 may determine that power switch 25 is switching-on (110) and to improve efficiency, controller unit 12 may cause driver 23 to enable low-ohmic output 37 (112). For example, at the start of the next switching cycle, controller unit 12 may first cause power switch 24 to switch-off (e.g., initially with low-ohmic output 36 of driver 22 being enabled, and then finish switching-off with high-ohmic output 34 of driver 22 being enabled). Next, controller unit 12 may cause driver 23 to switch-on power switch 25 with low-ohmic output 37 enabled so that driver 23 switches-on power switch 25 with the best efficiency.

The passive protection scheme associated with operations 100 may be combined with other types of protection schemes. For example, power switches 24 and 25 may be subjected to relatively little life time killing techniques along with the passive scheme to produce little or no increase to the $R_{DSON}$ associated with switches 24 and 25. Also the integration of a small intrinsic gate resistor with power switches 24 or 25, or the coupling of a small area of power switches 24 or 25 to an intrinsic gate resistor, may effectively be used in combination with the passive scheme described above.

Figure 3A:
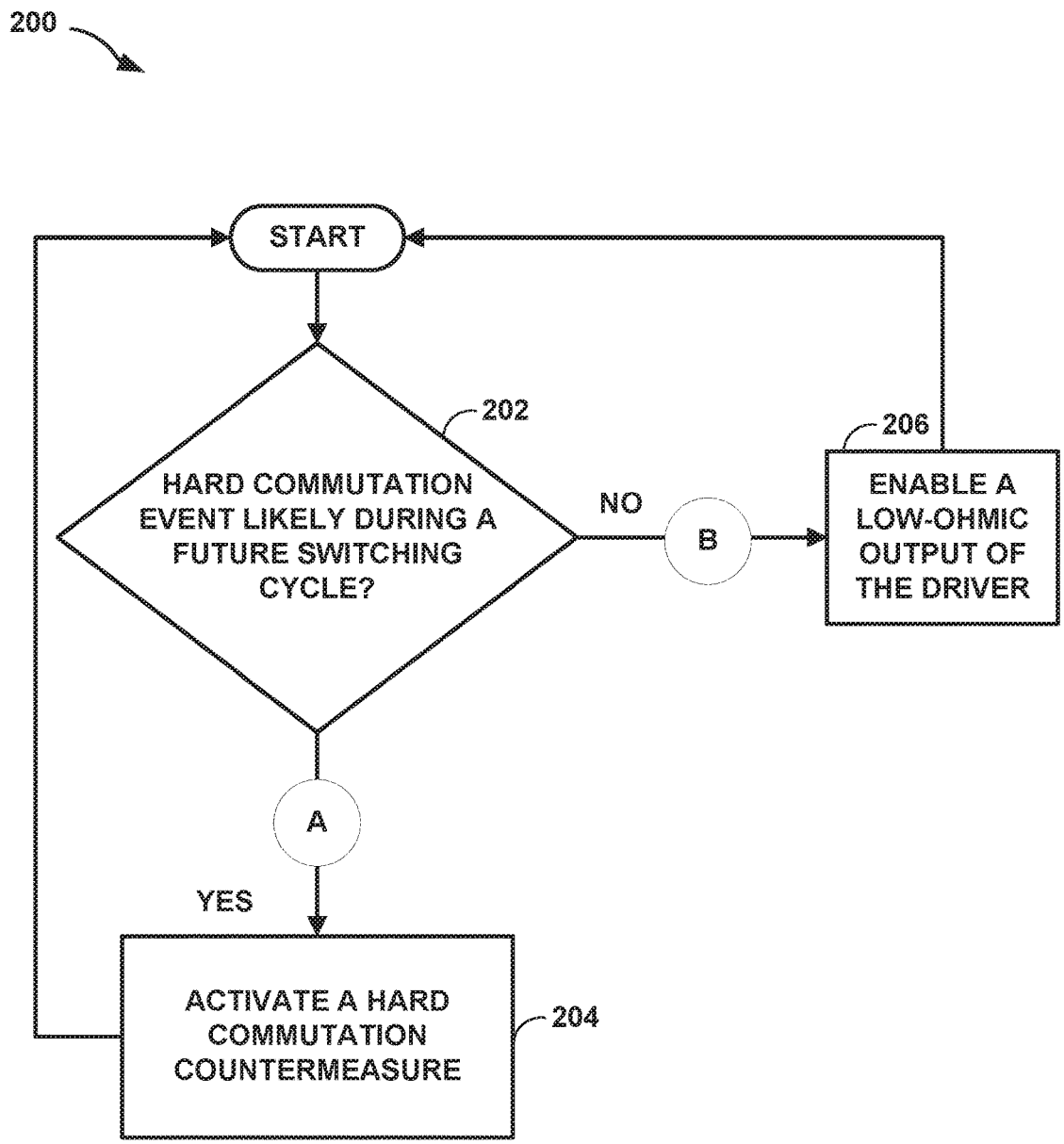
FIGS. 3A-3C are flowcharts illustrating operations of example active protection scheme for protecting a power switch from hard commutation events, in accordance with one or more aspects of the present disclosure.
Figure 3B:
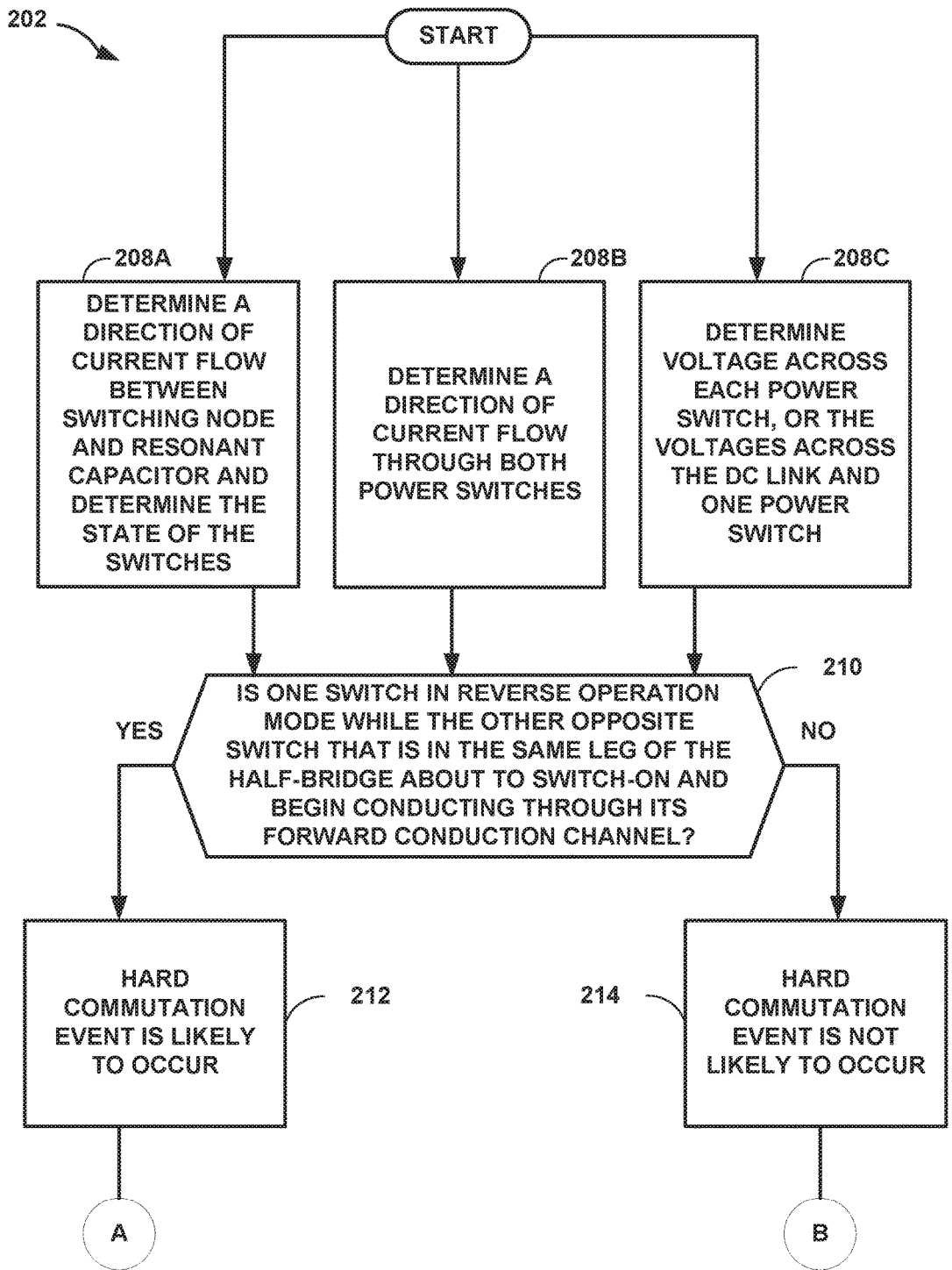
Figure 3C:
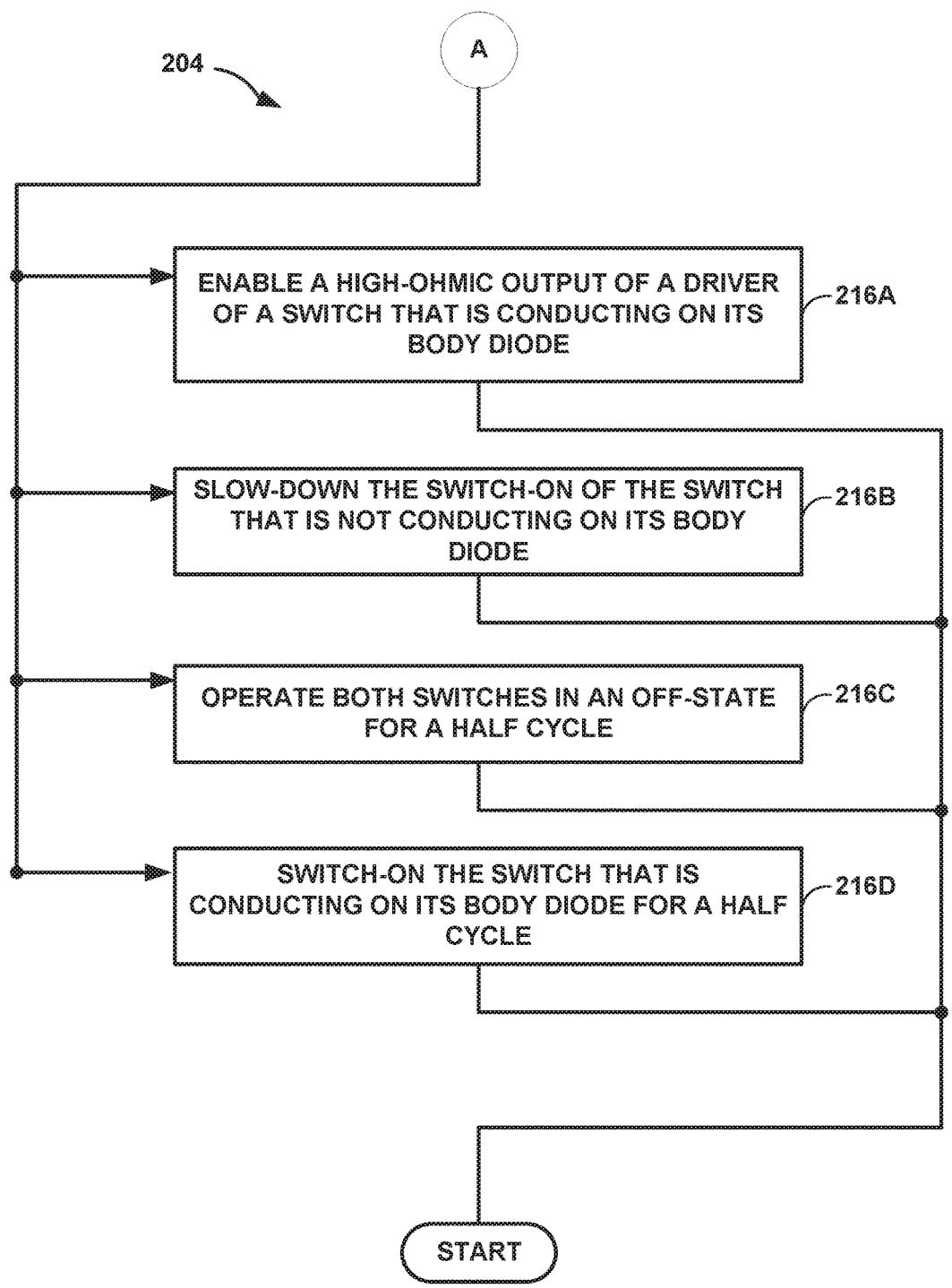

FIGS. 3A-3C are flowcharts illustrating operations 200 of an example active protection scheme for protecting power switches 24 and 25 from a hard commutation events, in accordance with one or more aspects of the present disclosure. FIGS. 3A-3C are described within the context of FIG. 1. For ease of description, operations 200 are primarily described as being performed by controller unit 12. However, in some examples, operations 200 may be performed by either of drivers 22 and 23, alone or in combination with controller unit 12. Unlike the passive protection scheme described with respect to operations 100 of FIG. 2, the active protection scheme associated with operations 200, may provide system 1 with a way to first predict whether a hard commutation event will likely occur before taking action, or refraining from taking action, to protect power switches 24 and 25 from hard commutation events.

FIG. 3A shows operations 200. FIG. 3B illustrates a more detailed view of operation 202 of operations 200 of FIG. 3A and FIG. 3C illustrates a more detailed view of operation 204 of operations 200 of FIG. 3A. Corresponding locations of the flowcharts of FIGS. 3A-3C are designated with labels "START", "A", and "B".

In the example of FIG. 3A, controller unit 12 may determine whether a hard commutation event is likely to occur at either of power switches 24 or 25 during a future (e.g., a next) switching cycle (202). Controller unit 12 may determine whether a hard commutation event is about to occur during the switch-on of a power switch in any of the various ways described below with respect to FIG. 3B and the additional FIGS. For instance, as one example, controller unit 12 may determine whether a hard commutation event is about to occur by analyzing the direction of current flowing at each of power switches 24 and 25.

Controller 12 may determine that a hard commutation is about to occur if the direction or polarities of currents at each of switches 24 and 25 indicates that one of switches 24 and 25 is conducting on its body diode while the other, opposite one of switches 24 and 25 is switching-on. For example, controller unit 12 may infer that when one of switches 24 and 25 is conducting on its body diode and is also about to switch-on (e.g., before the current through the body diode changes its direction (i.e., polarity) that no hard commutation will likely occur as a result of switching-on. However, controller unit 12 may infer that when one of switches 24 or 25 is conducting on its body diode while the other, opposite one of switches 24 and 25 is switching-on, that a hard commutation event (e.g., a current-shoot through) condition will likely occur.

Responsive to determining that a hard commutation event is likely to occur, controller unit 12 may activate a hard commutation countermeasure (204) to prevent, or at least reduce the amount of damaged caused by, the potential hard commutation event that is likely to occur. Various examples of countermeasures are described below with respect to FIG. 3C and the additional FIGS. In some examples, controller unit 12 may drive the power switch that is in reverse operation mode with a high-ohmic output from a driver. In some examples, controller unit 12 may drive the power switch that is switching-on using a high-ohmic output of a driver instead of a low-ohmic output of the driver in order to slow down the rate with which the switch switches-on. In some examples, controller unit 12 may switch-on the power switch that is already operating in reverse operation mode (e.g., for half of a switching cycle) to prevent the hard commutation from occurring. In some examples, controller unit 12 may delay the switch-on of the power switch that is due to switch-on to prevent the hard commutation from occurring.

Responsive to determining that a hard commutation event is not likely to occur, controller unit 12 may refrain from activating a hard commutation counter measure and instead, enable a low-ohmic output 37 of driver 23 (206) to allow power switch 25 to operate as efficiently as possible and without regard to hard commutations. In other words, controller unit 12 may activate or may maintain activation of low-ohmic outputs 36 and 37 of drivers 22 and 23 whenever controller unit 12 determines that a hard commutation event is not likely to occur in the next switching cycle.

In general, FIG. 3B is a more detailed example of operation 202 shown in FIG. 3A. In the example of FIG. 3B, controller unit 12 may determine whether a hard commutation event is likely to occur at power switch 24 and 25 during a future switching cycle (202) in any combination of three ways. FIG. 3B shows that in order for system 1 to make a determination about whether a hard commutation event is likely to occur (212) or not (214), system 1 first measure various electrical characteristics of the commutation loop of system 1 (208A-208C) in order to determine whether one of the power switches of the commutation loop is in reverse operation mode while the other, opposite switch, in the same leg of the half-bridge of the commutation loop is about to switch-on and begin conducting through its forward conduction channel (210).

In the example of FIG. 3B, controller unit 12 may determine a direction of current flow between switching node 32 and resonant capacitor 26 and the respective operating states of power switch 24 and 25 (208A). Based on the direction of the current flow between switching node 32 and resonant capacitor 26 and the respective operating states, controller unit 12 may infer whether either of switches 24 or 25 is operating in reverse operation mode while the other one of switches 24 and 25 is conducting via its forward conduction channel (210).

For example, controller unit 12 may receive information regarding the direction of the current flow between switching node 32 and resonant capacitor 26 from measurement unit 14. In this example, measurement unit 14 may be one or more current sensors or devices that can measure, via link 17, the polarity or the direction of the current flowing between switching node 32 and capacitor 26. Measurement unit 14 may sense from link 17 the direction of current flowing between switching node 32 and resonant capacitor 26, and provide the information over link 18B to controller unit 12. In some examples, power switches 24 and 25 may include monolithically integrated current sensors from which measurement unit 14 can detect the direction and level of current flowing through each of power switches 24 and 25.

Based on the information received from measurement unit 14 regarding the direction of the current flowing between switching node 32 and resonant capacitor 26, controller unit 12 and/or drivers 22 and 23 may determine the operating state of each of power switches 24 and 25. For example, since controller unit 12 outputs the gate drive signal, controller unit 12 can determine whether the current is flowing through the body diode of the switch that the gate drive signal indicates should be switched-off, or as forward current through the other switch that the gate drive signal indicates should be switched-on. Similarly, since drivers 22 and 23 receive the gate drive signal, drivers 22 and 23 can determine whether the current is flowing through the body diode of the switch that the gate drive signal indicates should be switched-off, or as forward current through the other switch that the gate drive signal indicates should be switched-on.

Based on the information received from measurement unit 14 regarding the direction of the current flowing between switching node 32 and resonant capacitor 26, coupled with a determination of the operating states of power switches 24 and 25, controller unit 12 may determine whether switch 24 is operating in reverse operation mode while switch 25 is about to switch-on and begin conducting via its forward conduction channel or whether switch 25 is operating in reverse operation mode while switch 24 is about to switch-on and begin conducting via its forward conduction channel (210). If either condition is true, controller unit 12 may determine that a hard commutation event is likely to occur during a future (e.g., subsequent) switching cycle (212), and if neither condition is true, controller unit 12 may determine that a hard commutation event is not likely to occur (214). For example, consider the following four cases where controller unit 12 may determine whether a hard commutation event is likely to occur when either of power switches 24 and 25 is operating in a switched-on state.

In a first case, controller unit 12 may determine that current is flowing from capacitor 26 into the half-bridge at switching node 32 when the gate drive signal associated with power switch 24 is driving power switch 24 to be switched-on. Based on the determination that the current is flowing into the half-bridge and that power switch 24 is switched-on, controller unit 12 may infer that the current must be flowing through the body diode of power switch 24 while the conduction channel parallel to the conducting body diode of power switch 24 is already switched-on. Accordingly, controller unit 12 may conclude that a hard commutation event is likely to occur, if switch 25 is about to switch on, before the current changes direction (as it should in normal operation).

In a second case, controller unit 12 may determine that current is flowing from capacitor 26 into the half-bridge at switching node 32 when the gate drive signal associated with power switch 25 is driving power switch 25 to be switched-on. Based on the determination that the current is flowing into the half-bridge and the power switch 25 is switched-on, controller unit 12 may infer that the current is flowing through the forward conduction channel of power switch 25 and conclude that a hard commutation event is not likely to occur.

Controller unit 12 may determine that current is flowing out of the half-bridge at switching node 32 and into capacitor 26 when the gate drive signal associated with power switch 24 is driving power switch 24 to be switched-on. Based on the determination that the current is flowing out of the half-bridge and that power switch 24 is switched-on, controller unit 12 may infer that the current is flowing through the forward conduction channel of power switch 24 and conclude that a hard commutation event is not likely to occur.

Controller unit 12 may determine that current is flowing out of the half-bridge at switching node 32 and into capacitor 26 when the gate drive signal associated with power switch 25 is driving power switch 25 to be switched-on. Based on the determination that the current is flowing out of the half-bridge and that power switch 25 is switched-on, controller unit 12 may infer that the current is flowing through the body diode of power switch 25 and that the conduction channel parallel to the conducting body diode of power switch 25 is already switched-on. Accordingly, controller unit 12 may conclude that a hard commutation event is likely to occur, if switch 24 is about to switch on, before the current changes direction (as it should in normal operation).

Likewise, consider the following additional cases where controller unit 12 may determine whether a hard commutation event is likely to occur when either of power switches 24 and 25 is operating in a switched-off state. In a first case, controller unit 12 may determine based on the gate drive signal associated with power switch 25 that power switch 25 is switched-off, and also determine that current is flowing from capacitor 26 into switching node 32. Responsive to determining that power switch 25 is switched off and current is flowing into switching node 32, controller unit 12 may determine that the body diode of power switch 24 is conducting. Controller unit 12 may determine that if power switch 25 is switched-on while the body diode of power switch 24 is conducting (210), that a hard commutation event is likely to occur at the body diode of power switch 24 (212) and may activate a counter measure to prevent the hard commutation event from occurring and/or at least reduce its potential for damage to power circuit 6.

In a second case, controller unit 12 may determine based on the gate drive signal associated with power switch 24 that power switch 24 is switched-off and the current is flowing out of switching node 32 and into capacitor 26. Based on the determination that power switch 24 is switched-off and current is flowing out of switching node 32, controller unit 12 may determine that the body diode of power switch 25 is conducting. Controller unit 12 may determine that if power switch 24 is switched-on while the body diode of power switch 25 is conducting (210), that a hard commutation event is likely to occur at the body diode of power switch 25 (212) and may activate a counter measure to prevent the hard commutation event from occurring and/or at least reduce its potential for damage to power circuit 6.

In the example of FIG. 3B, controller unit 12 may determine the direction or polarity of current flowing through power switches 24 and 25 (208B), and based on the direction of the current flowing through power switches 24 and 25, controller unit 12 may determine whether a hard commutation event is likely to occur during the next switching cycle (202). For example, controller unit 12 may receive information from measurement unit 14 that indicates the direction or polarity of the current flowing through each of power switches 24 and 25. In some examples, power switches 24 and 25 may include integrated current mirrors, sense MOSFETs, sense resistors, Hall sensors, etc. from which measurement unit 14 may sense the currents flowing through each of power switches 24 and 25. Measurement unit 14 may provide an indication of the direction of current flowing through power switches 24 and 25 over link 18B to controller unit 12, from which controller unit 12 may determine whether one of power switches 24 and 25 is in reverse operation mode while the other, opposite one of power switches 24 and 25 is about to switch-on and begin conducting through its forward conduction channel (210). For example, controller unit 12 may conclude that a hard commutation event is likely to occur if the direction of current flowing through power switches 24 indicates that power switch 24 is operating in reverse operation mode when power switch 25 is about to switch-on and begin conducting through its forward conduction channel. Controller unit 12 may conclude that a hard commutation is likely to occur if the direction of current flowing through power switch 25 indicates that power switch 25 is instead operating in reverse operation mode when power switch 24 about to switch-on and begin conducting through its forward conduction channel (210).

In response to determining that a hard commutation event will likely occur (212), controller unit 12 may activate a counter measure to prevent the hard commutation event and/or at least reduce its potential for damage to power circuit 6. Otherwise, controller unit 12 may determine that a hard commutation event is not likely to occur (214) and may refrain from activating a counter measure (e.g., and may enable or continue to use low-ohmic output 34 and 37 of drivers 22 and 23 to maintain operational efficiency).

In the example of FIG. 3B, controller unit 12 may measure a voltage drop across one of power switches 24 and 25 and the voltage drop across the DC link of power circuit 6 (208C) to infer whether or not either of power switches 24 and 25 is conducting on its respective body diode and therefore operating in reverse operation mode.

For example, controller unit 12 may receive information from measurement unit 14 that indicates the voltage across only one of power switches 24 and 25 and the DC link voltage. As one example, the information obtained from measurement unit 14 may indicate to controller unit 12 that the DC link voltage is approximately 380V and that the voltage across power switch 24 is 300V. Using the information about the voltage across power switch 24 and the DC link voltage, controller unit 12 may determine that the rest of the DC link voltage (i.e., 80V) is across power switch 25 and therefore, determine that the voltage across power switch 25 is not negative. Controller unit 12 may conclude that power switch 25 is not operating in reverse operation mode if power switch 25 is already operating in a switched-off state while the voltage across power switch 25 is not negative.

As one example, the information obtained from measurement unit 14 may indicate that the DC link voltage is approximately 380V, and that the voltage across power switch 24 is greater than 380V. Using the information about the voltage across power switch 24 and the DC link voltage, controller unit 12 may determine that the voltage across power switch 25 is negative. Controller unit 12 may conclude that power switch 25 is operating in reverse operation mode if power switch 25 is already operating in a switched-off state when the voltage across power switch 25 is negative.

In the example of FIG. 3B, controller unit 12 may measure the voltage drop across each of power switches 24 and 25 (208C) to infer whether or not either of power switches 24 and 25 is conducting on its respective body diode and therefore operating in reverse operation mode. For example, controller unit 12 may receive information from measurement unit 14 that indicates the voltage drop across each of power switches 24 and 25. Controller unit 12 may determine that a negative voltage drop across any one power switch, is an indication that the respective power switch is conducting on its body diode (i.e., that the body diode of the respective power switch is conducting).

Controller unit 12 may determine that a hard commutation event is likely to occur in response to determining that the voltage across one of power switches 24 and 25 is negative when the other, opposite one of power switches 24 and 25 is about to be switched-on, (212). Conversely, controller unit 12 may determine that a hard commutation event is not likely to occur in response to determining that the voltage across one of power switches 24 and 25 is not negative while the other, opposite one of power switches 24 and 25 is about to be switched-on.

In summary, controller unit 12 may determine that if one of power switches 24 or 25 is switched-on while the other one of power switches 24 is in reverse operation mode (210), that a hard commutation event is likely to occur (212) and may activate a counter measure to prevent the hard commutation event and/or at least reduce its potential for damage to power circuit 6. Otherwise, controller unit 12 may determine that a hard commutation event is not likely to occur and may refrain from activating a counter measure (e.g., and may enable low-ohmic output 34 and 37 of drivers 22 and 23 to maintain operational efficiency).

FIG. 3C is a more detailed example of operation 204 shown in FIG. 3A. In the example of FIG. 3C, controller unit 12 may activate a hard commutation counter measure (204) in any suitable combination of the following four ways outlined below with respect to operations (216A)-(216D). In the example of FIG. 3C, upon determining that a hard commutation event is likely to occur in the next switching cycle (202), controller unit 12 may enable a high-ohmic output of a driver of a switch that is conducting on its body diode (216A) to protect the switch from the impending hard commutation event. For example, after determining that power switch 24 is conducting on its body diode and power switch 25 is about to switch-on to begin conducting on its forward conduction channel, controller unit 12 may determine that a hard commutation event will likely occur in the next switching cycle (202) and in response to determining that the hard commutation event is likely to occur in the next switching cycle, controller unit 12 may enable high-ohmic output 34 of driver 22 to protect power switches 24 and 25 from a hard commutation event. In some examples, controller unit 12 may first switch-off power switch 24 before enabling high-ohmic output 34.

Conversely, after determining that power switch 25 is conducting on its body diode and power switch 24 is about to switch on to begin conducting on its forward conduction channel, controller unit 12 may determine that a hard commutation event will likely occur in the next switching cycle (202) and in response to determining that the hard commutation event is likely to occur in the next switching cycle, controller unit 12 may enable high-ohmic output 35 of driver 23 to protect power switches 24 and 25 from the impending hard commutation event. In some examples, controller unit 12 may first switch-off power switch 25 before enabling high-ohmic output 35.

In this way, when high-ohmic output 35 is enabled, the gate of power switch 25 is coupled, in a relatively high-ohmic way, to the ground of driver 23 so that if a hard commutation of the body diode of power switch 25 does occur (as controller unit 12 expects) power switch 25 will automatically switch-on its forward conduction channel in response to a voltage change (dv/dt) triggered switch-on through the intrinsic reverse capacitance of power switch 25. Likewise, when high-ohmic output 34 is enabled, the gate of power switch 24 is coupled, in a relatively high-ohmic way, to the ground of driver 22 so that if a hard commutation of the body diode of power switch 24 does occur, power switch 24 will automatically switch-on its forward conduction channel in response to a voltage change (dv/dt) triggered switch-on through the intrinsic reverse capacitance of power switch 24.

By minimizing hard commutation events with a high-ohmic output, a power switch under hard commutation can turn-on its forward conduction channel being triggered through by a high rate of change to the voltage (e.g., dv/dt) on the drain electrode. Accordingly, the overvoltage peak at the power switch may be limited and the power switch may more likely survive critical conditions. Moreover, whenever a hard commutation event will not occur in the next switching cycle, controller unit 12 may command the driver to switch back to or maintain a low-ohmic output, and as such, the power switch may operate efficiently with the low-ohmic output activated during normal operation. In addition, by minimizing hard commutation events with a high-ohmic output, the driver may increase the lifespan of the power switch.

In the example of FIG. 3C, upon determining that a hard commutation event is likely to occur in the next switching cycle (202), controller unit 12 may slow-down the switch-on of the power switch that is not conducting on its body diode (216B) and about to switch-on. For example, one way to minimize the voltage overshoot caused by a hard commutation is to slow-down the switch-on of the power switch that is about to be switched on to begin conducting on its forward conduction channel. One way to slow down the switch-on of a switch is to drive the switch on with a high-ohmic output, rather than a low-ohmic output. For instance, after determining that power switch 25 is conducting on its body diode and power switch 24 is about to be switched on, controller unit 12 may determine that a hard commutation event will likely occur in the next switching cycle (202) and in response to determining that the hard commutation event is likely to occur in the next switching cycle, controller unit 12 may enable high-ohmic output 34 of driver 22 to slow-down and/or change the slope of the switch on of power switch 24 as ways to minimize and/or prevent power switches 24 and 25 from being damaged by a hard commutation.

In the example of FIG. 3C, upon determining that a hard commutation event is likely to occur in the next switching cycle (202), controller unit 12 may operate both switches of a half-bridge in the switched-off state or otherwise refrain from switching-on the switch that is due to switch-on (e.g., for a half of a switching cycle) (216C). In other words, controller unit 12 may wait until the switch that is conducting on its body diode is no longer operating in reverse operation mode before determining that the other switch can be safely switched on without causing a hard commutation. If power switches 24 and 25 are both switched-off, and power switch 25 is due to switch-on next, controller unit 12 may wait until the current and/or the voltage associated with power switch 24 is not negative before providing a driver control signal to driver 23 commanding driver 23 to switch-on power switch 25.

In the example of FIG. 3C, upon determining that a hard commutation event is likely to occur in the next switching cycle (202), controller unit 12 may switch-on the switch that is conducting on its body diode for a half switching cycle (216D) rather than switching-on the switch that is due to switch-on. In other words, rather than potentially causing a hard commutation event by switching-on one power switch while the other power switch is in reverse operation mode, controller unit 12 may switch the power switch that is conducting on its body diode back-on for a half switching cycle as a way to prevent the hard commutation event from occurring. In other words, if power switches 24 and 25 are operating in a switched-off state, and power switch 24 is in reverse operation mode when power switch 25 is due to be switched-on, controller unit 12 may switch power switch 24 back-on for a partial switching cycle (e.g., a portion of a switching cycle such as half, a quarter, a third, etc.) as a way to prevent the hard commutation event from happening.

In any event, controller unit 12 may activate any combination of the hard commutation countermeasures of operations (216A)-(216D) to prevent, or at least reduce the amount damaged caused by, the hard commutation event that is likely to occur. In this way, operations 200 may provide a more cost effective and simpler way for a power circuit to protect one or both power switches of a half-bridge without having to rely on more rugged and expensive MOSFETS.

FIGS. 4-7 are block diagrams each illustrating an example system that includes a power circuit configured to protect a power switch from a hard commutation event, in accordance with one or more aspects of the present disclosure. FIGS. 4-7 are described below in the context of system 1 of FIG. 1, and operations 100 and 200 of FIGS. 2 and 3A-3C.

Figure 4:
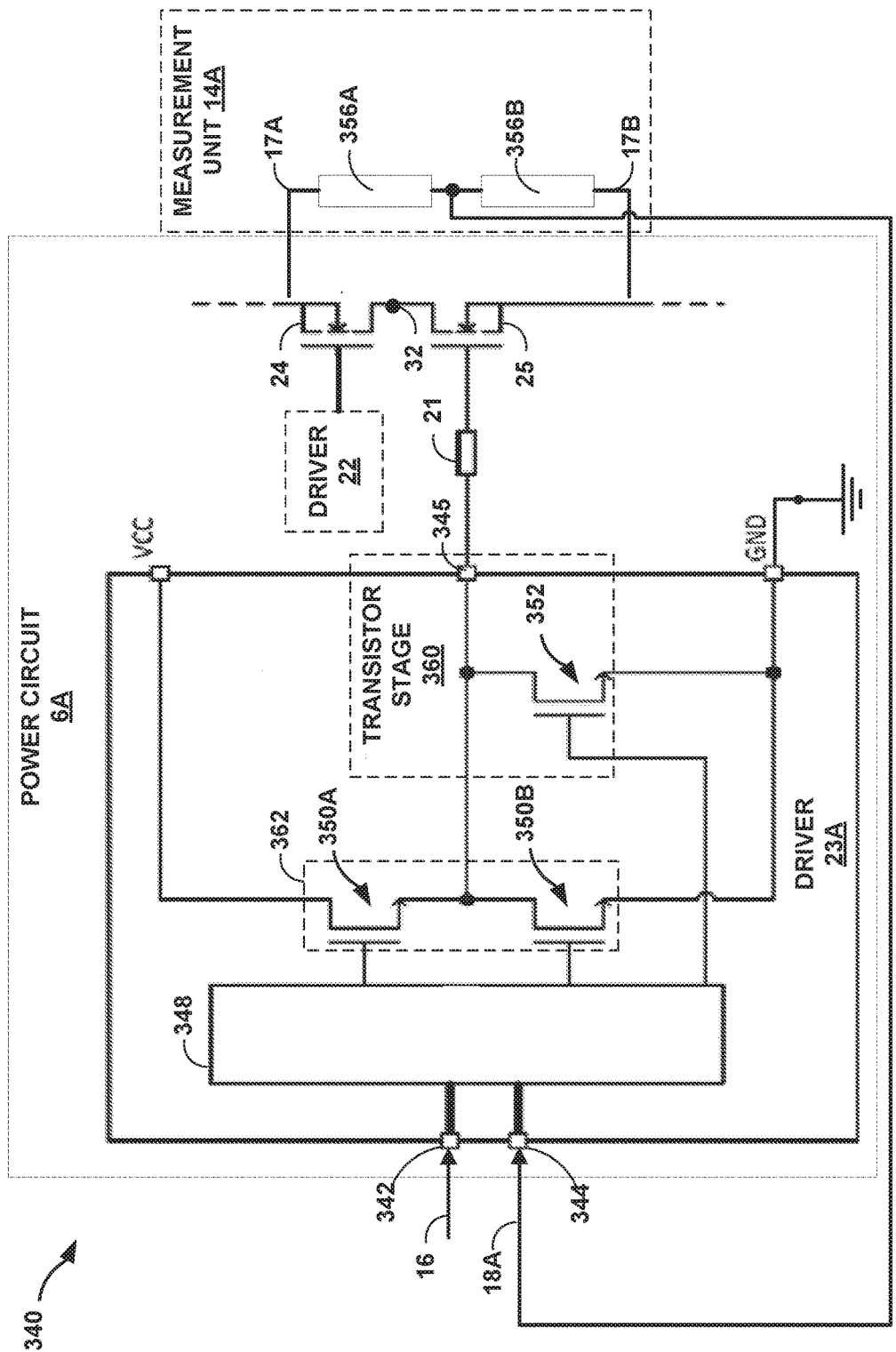
FIGS. 4-7 are block diagrams each illustrating an example system that includes a power circuit configured to protect a power switch from a hard commutation event, in accordance with one or more aspects of the present disclosure.

FIG. 4 shows system 340, which includes one example of a driver with variable output impedance. System 340 of FIG. 4 includes power circuit 6A, measurement unit 14A, power switches 24 and 25, and drivers 22 and 23A. Drivers 22 and 23A are configured to drive, respectively, power switches 24 and 25, so as to vary a voltage at switching node 32. System 340 further includes gate resistor 21 arranged between the gate terminal of power switch 25 and output node 345 of driver 23A.

Driver 23A is coupled to VCC and GND and includes input nodes 342 and 344 and output node 345. Driver 23A outputs a gate signal via output node 345 to cause power switch 25 to switch-on or switch-off. At input node 342, driver 23A may receive driver control signals from a controller, such as controller unit 12 of FIG. 1. At input node 344, driver 23A may receive information from measurement unit 14A that pertains to various voltage characteristics associated with system 340.

Driver 23A includes transistors 350A-350B which are transistors (e.g., field-effect-transistor [FET], junction gate field-effect transistor [JFET], MOSFET, and the like) of transistor stage 362. Driver 23A also includes transistor 352 which is a transistor (e.g., FET, JFET, MOSFET, and the like) of transistor stage 360. Transistor stage 360 may have a relatively high-ohmic resistance as compared to transistor stage 362. In other words, when transistor stage 360 is enabled, driver 23A may have a high-ohmic impedance (e.g., between 5 and 100 ohms) at output node 345. Alternatively, when transistor 362 is enabled, driver 32A may have low-ohmic impedance (e.g., between 0, 1 and 5 ohms) at output node 345.

Driver 23A includes logic unit 348 for processing inputs for controlling the output of driver 23A. Logic unit 348 may include any one or more microprocessors, multiplexers, arithmetic logic units (ALUs), registers, or any other equivalent integrated or discrete logic circuitry, as well as any combinations of such components. When logic unit 348 includes software or firmware, logic unit 348 further includes any necessary hardware for storing and executing the software or firmware, such as one or more processors or processing units.

Logic unit 348 of driver 23A may control transistor stages 360 and 362 to vary the voltage level (e.g., between VCC and GND) of the gate signal that driver 23A outputs to power switch 25 at output node 345 based on the driver control signals received at input node 342. For example, logic unit 348 may interpret the driver control signal as a command to operate power switch 25 in a switched-on state and in response, logic unit 348 may couple output node 345 to VCC by switching-off transistors 350B and 352 and switching-on transistor 350A. Logic unit 348 may interpret the driver control signal as a command to cause power switch 25 to operate in a switched-off state and in response, logic unit 348 may couple output node 345 to GND by switching-off transistor 350A while switching-on transistor 350B and/or transistor 352. For example, power switch 25 may switch off faster if transistors 350B and 352 are switched-on at the same time.

In some examples, logic unit 348 of driver 23A may interpret the driver control signals as a command to vary the impedance of output node 345 (e.g., to enable or refraining from enabling transistor stage 360) to protect power switch 25 from a hard commutation event (e.g., as a hard commutation countermeasure). For example, logic unit 348 may interpret the driver control signal as a command to cause power switch 25 to operate in a switched-off state using a low-impedance output and in response, logic unit 348 may couple output node 345 to GND by switching-off transistors 350A and switching-on transistors 352 and/or 350B. Logic unit 348 may interpret the driver control signal as a command to operate power switch 25 in a switched-off state using a high-impedance output and in response, logic unit 348 may couple output node 345 to GND by switching-off transistors 350A and 350B and switching-on transistor 352.

In some examples, logic unit 348 of driver 23A may analyze the information from measurement unit 14A that pertains to various voltage characteristics associated with system 340 to determine whether a hard commutation event is likely to occur at power switches 24 and 25. For example, logic unit 348 may obtain information about the direction of current flowing through power switches 24 and 25, the voltage across at least one of power switches 24 and 25, the operating state of each of power switches 24 and 25, the voltage across the DC link of system 340, etc. By performing operations similar to operations 202 of FIG. 3B, driver 23A may determine whether a hard commutation event is likely to occur or not at power switches 24 and 25.

In the example of FIG. 4, measurement unit 14A includes a voltage divider formed by resistors 356A and 356B across power switch 24 and 25. Measurement unit 14A may include other elements than those shown in FIG. 4, such as, but not limited to, current sensors, and the like. Measurement unit 14A may provide driver 23A with information that indicates the voltage across at least one of power switches 24 and 25 and the voltage across the DC link of system 340, or the voltage across both of power switches 24 and 25. From the information received from measurement unit 14A, logic unit 348 may determine whether either of power switches 24 and 25 is in reverse operation mode by determining whether the voltage across either of power switches 24 and 25 is less than zero volts.

For example, similar to the determinations made following operations 208C of FIG. 3B, logic unit 348 may receive information from measurement unit 14A pertaining to the voltage drop across one of power switches 24 and 25 and the voltage drop across the DC link of power circuit 6 (208C) to infer whether or not either of power switches 24 and 25 is conducting on its respective body diode and therefore operating in reverse operation mode. As one example, the information obtained from measurement unit 14A may indicate to logic unit 348 that the DC link voltage is approximately equal to a voltage threshold (e.g., 380V) and that the voltage across power switch 24 is less than the voltage threshold (e.g., 300V).

Logic unit 348 may determine that the rest of the DC link voltage (i.e., 80V) is across power switch 25 and as such, the voltage across power switch 25 is not negative. Logic unit 348 may determine that if power switch 25 is already switched-off, and has a non-negative voltage drop across it, that power switch 25 is not in reverse operation mode and therefore, there is not a risk for a hard commutation if power switch 24 is switched on. If however, the information obtained from measurement unit 14A indicates that the voltage across power switch 24 (e.g., 400V) is greater than the voltage threshold, logic unit 348 may determine that the voltage across power switch 25, while switched off, is negative (i.e., −2V) and that power switch 25 is in reverse operation mode and therefore that there is a risk for a hard commutation if power switch 24 is switched on.

In some examples, logic unit 348 may operate according to the passive scheme for protecting against hard commutation events. Logic unit 348 may initially activate transistor 350 to enable the low-ohmic output of driver 23A when logic unit 348 begins driving power switch 25 to a switched-off state. Later, logic unit 348 may instead activate transistor 352 and/or transistor 350B to enable the high-ohmic output of driver 23A for the remaining amount of time when logic unit 348 is driving power switch 25 to a switched-off state.

Figure 5:
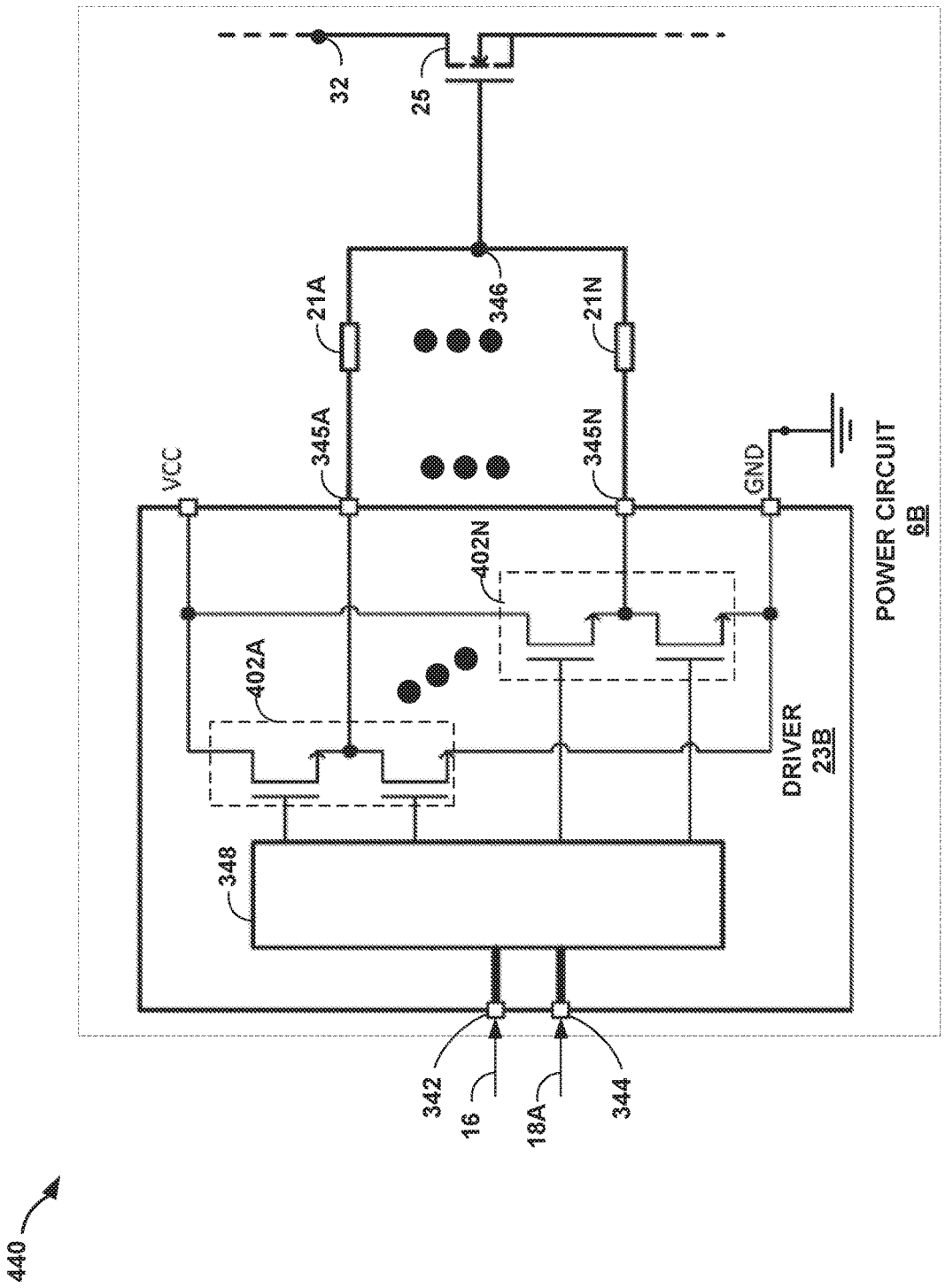

FIG. 5 shows system 380, which includes one example of a driver with multiple, separate outputs, with each output being configured to output a gate signal at a different impedance level. System 380 of FIG. 5 includes power circuit 6B, power switch 25, and driver 23B. Driver 23B is configured to drive power switch 25, so as to vary a voltage at switching node 32. System 380 further includes gate resistors 21A-21N (collectively referred to as "gate resistors 21") arranged between the gate terminal of power switch 25 and output nodes 345A-345N (collectively referred to as "output nodes 345) of driver 23B.

Driver 23B outputs a gate signal via output nodes 345 to cause power switch 25 to switch-on or switch-off. Each of output nodes 345 couples a respective one of gate resistors 21 to a respective one of transistor stages 402A-402N (collectively referred to as "transistor stages 345"). Each one of transistor stages 402 includes two (i.e., high-side and low-side) transistors (e.g., FET, JFET, MOSFET, and the like). When the high-side transistor of each transistor stage 402 is activated, the high-side transistor couples its respective one of output nodes 345 to VCC. Alternatively, when the low-side transistor of each transistor stage 402 is activated, the low-side transistor couples its respective one of output nodes 345 to GND.

Each of transistor stages 402 has a different corresponding gate resistor 21. Whenever driver 23B produces a gate signal at node 346, driver 23B selects and enables one of transistor stages 402 based on corresponding gate resistor 21 in order to vary the impedance of the output stage of driver 23B so that the current associated with the gate signal is limited by the corresponding gate resistor 21. One benefit of driver 23C is that the corresponding gate resistor 21 can be selected to have the desired output impedance associated with each of transistor stages 402, while the output impedances of each of transistor stages 402 alone (i.e., without gate resistors 21) may be the same. For example, consider an embodiment where the desired high ohmic output impedance of driver 23B is 20 Ohm. With a Miller plateau voltage of 5V VCC, driver 23B would produce a gate signal with a current of around 250 mA. The sinking capability of stage 402N may be selected to be approximately 300 mA so as to ensures that the voltage drop of 5V (Miller plateau voltage minus GND) falls off across the gate resistor 21N and not across the output stage.

Logic unit 348 may enable transistor stage 402A to drive power switch 25 with a low-ohmic output and may instead, enable transistor stage 402N to drive power switch 25 with a high-ohmic output. For example, logic unit 348 may determine that a hard commutation event is about to occur at power switch 25 and may enable transistor stage 402N to protect power switch 25 or at least minimize the amount of damage that may be caused to power switch 25 from the hard commutation event. As another example, logic unit 348 may enable transistor stage 402A to drive power switch 25 to a switched-on state with a low-ohmic output and receive information via links 16 and 18A that indicates a hard commutation event is about to occur (e.g., if the voltage across power switch 24 is negative, etc.). To prevent the hard commutation event from occurring, logic unit 348 may deactivate transistor stage 402A and instead, enable transistor stage 402N so that driver 23B drives power switch 25 to a switched-on state more slowly.

Figure 6:
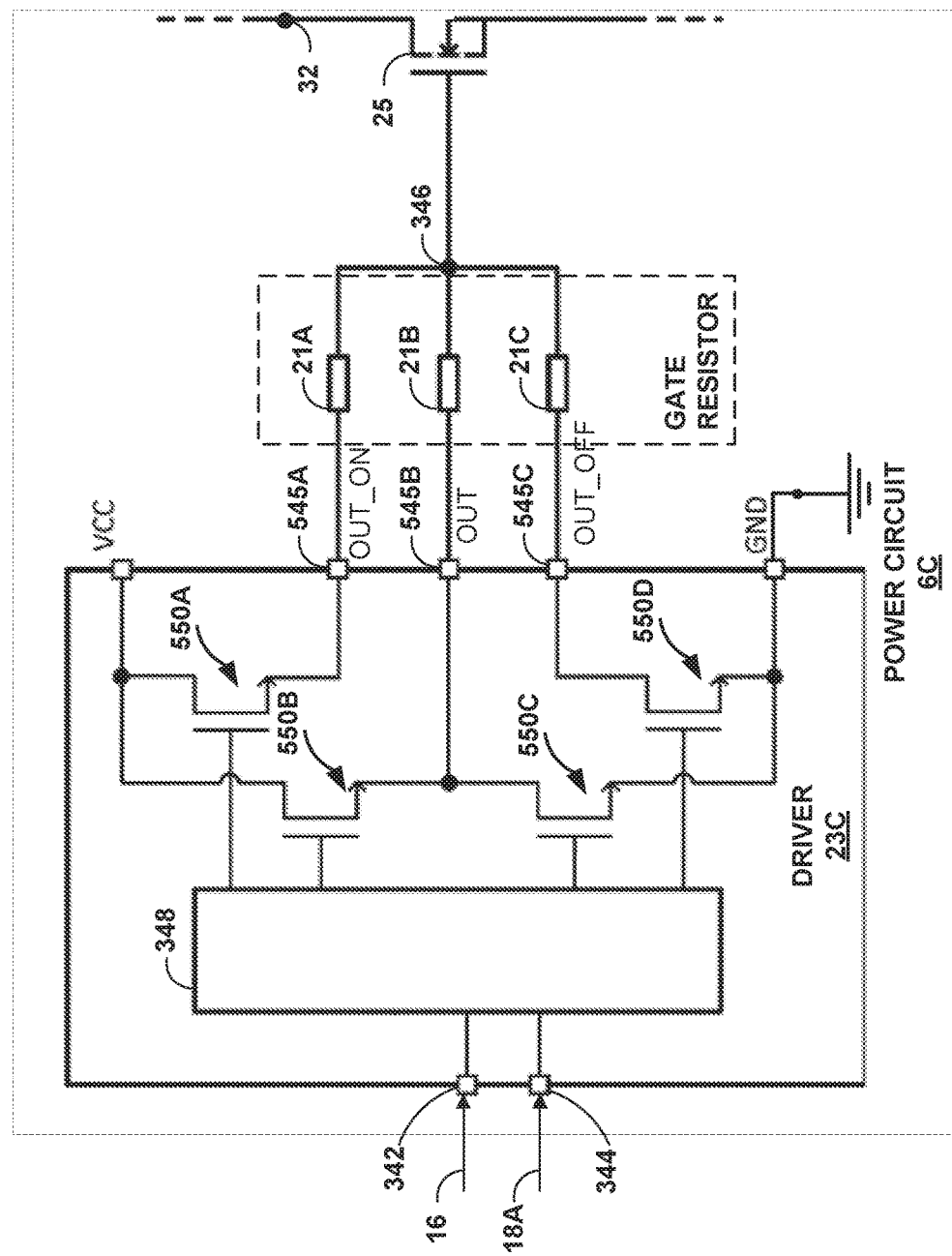

FIG. 6 shows system 540, which includes one example of a driver with a single output port and two additional switch-on and switch-off ports. System 540 of FIG. 6 includes power circuit 6C, power switch 25, and driver 23C. Driver 23C is configured to drive power switch 25, so as to vary a voltage at switching node 32. System 540 further includes gate resistors 21A-21C (collectively referred to as "gate resistors 21") arranged between the gate terminal of power switch 25 and output nodes 545A-545C (collectively referred to as "output nodes 345) of driver 23C. Driver 23C includes transistors 550A-550D (collectively "transistors 550"). Transistors 550A and 550D may have a greater impedance value than transistors 550B and 550C. Driver 23C may enable different combinations of transistors 550 to create different impedance paths through one or more of resistors 21 as a way to vary the impedance at node 346. Driver 23C may rely on higher resistance gate resistors 21 for high ohmic output e.g. for gate resistor 21A and 21C.

Output node 545B is a low-ohmic output port from which driver 23C is configured to provide a gate signal to power switch 25. Transistors 550A and 550B are matched to gate resistor 21B so as to provide the desired low-ohmic output impedance.

Output nodes 545A and 545C are, respectively, high-ohmic switch-on and high-ohmic switch-off output ports that are enabled or disabled whenever driver 23C needs to provide, in a high-ohmic way, a gate signal to power switch 25. Transistors 550A, and 550D are matched to gate resistors 21 A and 21C respectively so as to provide the desired high-ohmic output impedance. That is, if a relatively high external gate resistor is used, the current capability of the respective output stage can be chosen relatively low.

For example, during operation, when there is no risk of a hard commutation or no need to prevent a hard commutation, logic unit 348 may cause driver 23C to provide a gate signal at node 346 in a low-ohmic way by relying on output 545B and gate resistor 21B. Logic unit 348 may switch-off transistors 550A, 550C, and 550D and switch-on transistor 550B to provide, in a low-ohmic way, a gate signal to power switch 25. Alternatively logic unit 348 may switch off transistors 550 C and 550D and switch-on transistors 550A and 550B.

When logic unit 348 determines that there is a risk of a hard commutation or there is a need to prevent a hard commutation, logic unit 348 may cause driver 23C to provide a gate signal at node 346 in a high-ohmic way by relying on output node 545A or output node 545C. For example, to switch-on switch 25 in a high-ohmic manner logic unit 348 may switch on transistor 550A (and switch off transistors 550B, 550C and 550D). To switch-off switch 25 in a high-ohmic manner logic unit 348 may switch on transistor 550D (and switch off transistors 550A, 550B and 550C).

Figure 7:
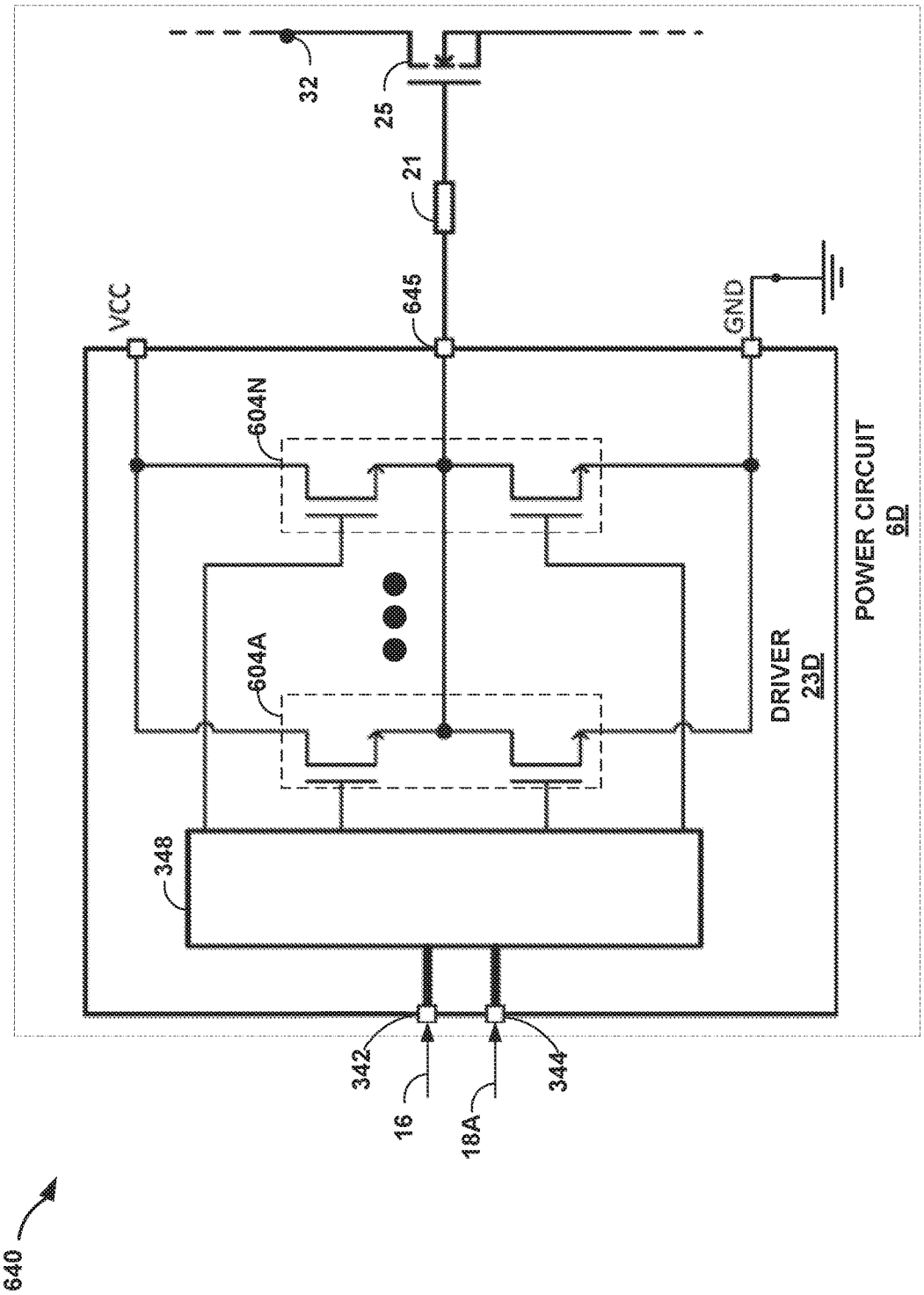

FIG. 7 shows system 640, which includes one example of a driver with a single output port and multiple transistor stages to drive a gate signal at the output port. System 640 of FIG. 7 includes power circuit 6D, power switch 25, and driver 23D. Driver 23D is configured to drive power switch 25 by providing a gate signal at output node 645, so as to vary a voltage at switching node 32.

Driver 23D includes transistor stages 604A-604N (collectively referred to as transistor stages 604). Each one of transistor stages 604 includes two (i.e., high-side and low-side) transistors (e.g., FET, JFET, MOSFET, and the like). When the high-side transistor of each transistor stage 604 is activated, the high-side transistor couples output node 645 to VCC. Alternatively, when the low-side transistor of each transistor stage 604 is activated, the low-side transistor couples output nodes 645 to GND.

The high and low-side transistors of each one of transistor stages 604 may have different impedance than the high and low-side transistors of each of the other transistor stages 604. The high and low-side transistors of transistor stage 604N may have a relatively high-ohmic resistance as compared to the high and low-side transistors of transistor stage 604A. When the high-side transistor of transistor stage 604N is activated by logic unit 348, driver 23D may produce a gate signal at node 645 that has a relatively high-ohmic impedance as compared to when driver 23D activates the high-side transistor of transistor stage 604A. Likewise, when the low-side transistor of transistor stage 604N is activated by logic unit 348, driver 23D may produce a gate signal at node 645 that has a relatively high-ohmic impedance as compared to when driver 23D activates the low-side transistor of transistor stage 604A. In some examples, when producing a gate signal at node 645 that has a relatively low-ohmic impedance, driver 23D may activate a combination of one or all of transistor stages 604 and not just transistor stage 604A.

Logic unit 348 may enable transistor stage 604A to drive power switch 25 in a low-ohmic way and may instead, enable transistor stage 604N to drive power switch 25 in a high-ohmic way. For example, logic unit 348 may determine that a hard commutation event is about to occur at power switch 25 and may enable transistor stage 604N to protect power switch 25 or at least minimize the amount of damage that may be caused to power switch 25 from the hard commutation event. As another example, logic unit 348 may enable transistor stage 604A to drive power switch 25 to a switched-on state with a low-ohmic output and receive information via links 16 and 18A that indicates a hard commutation event is about to occur (e.g., if the voltage across power switch 24 is negative, etc.). To prevent the hard commutation event from occurring, logic unit 348 may disable transistor stage 604A and instead, enable transistor stage 604N so that driver 23D can drive power switch 25 to a switched-on state more slowly (e.g., in a high-ohmic way).

Figure 8:
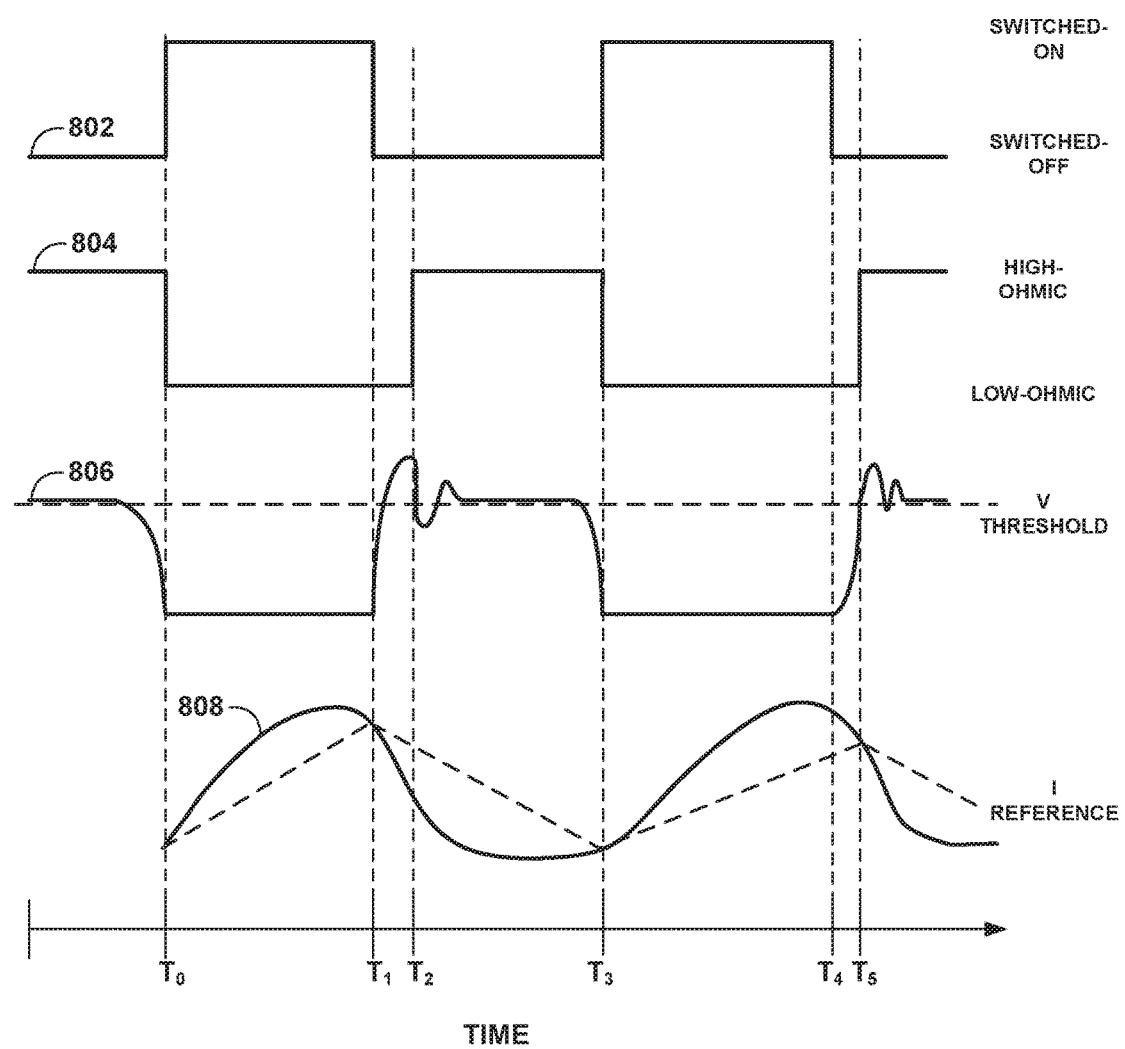
FIG. 8 is a timing diagram illustrating example electrical characteristics of the example system of FIG. 1 that includes a power circuit configured to protect a power switch from a hard commutation event, in accordance with one or more aspects of the present disclosure.

FIG. 8 is a timing diagram illustrating example electrical characteristics of a power switch while being controlled by an example system, in accordance with one or more aspects of the present disclosure. FIG. 8 is described within the context of FIG. 1 and operations 100 and 200 of FIGS. 2 and 3A-3C.

FIG. 8 shows various electrical characteristics of power switch 25 between times T0 and T5. FIG. 8 depicts variations in gate signal 802 provided by driver 23 to the gate of power switch 25, impedance level 804 (e.g., high-ohmic or low-ohmic) associated with gate signal 802, drain-source voltage 806 of power switch 25, and current 808 of power switch 25.

In the example of FIG. 8, at time T0, power switch 24 is operating in a switched-on state and power switch 25 is switched-off. Between times T0 and T1, impedance level 804 is low which indicates that gate signal 802 is being driven by driver 23 with low-ohmic output 37 to improve efficiency. At time T1, gate signal 802 changes and drives power switch 24 to begin switching to a switched-off state. Between times T1 and T2 is a fixed delay. After the fixed delay, at time T2, impedance level 804 goes high which indicates that driver 23 is implementing a passive protection scheme to begin protecting power switch 24 from hard commutation events by enabling high-ohmic output 35 while continuing to drive (and eventually maintain) power switch 24 in a switched-off state.

At time T3, power switch 24 is driven back into the switched-on state with low-ohmic output 37 being enabled to improve efficiency. At time T4, gate signal 802 changes and drives power switch 24 to a switched-off state again with low-ohmic output 37 enabled so as to improve efficiency. At time T5, impedance level 804 goes high which indicates that driver 23 is implementing an active protection scheme to protect power switch 24 from hard commutation events by enabling high-ohmic output 35 while maintaining power switch 24 in a switched-off state when the voltage across power switch 24 exceeds a voltage threshold (e.g., 380V) or when the current at power switch 24 drops below a reference current.

Figure 9A:
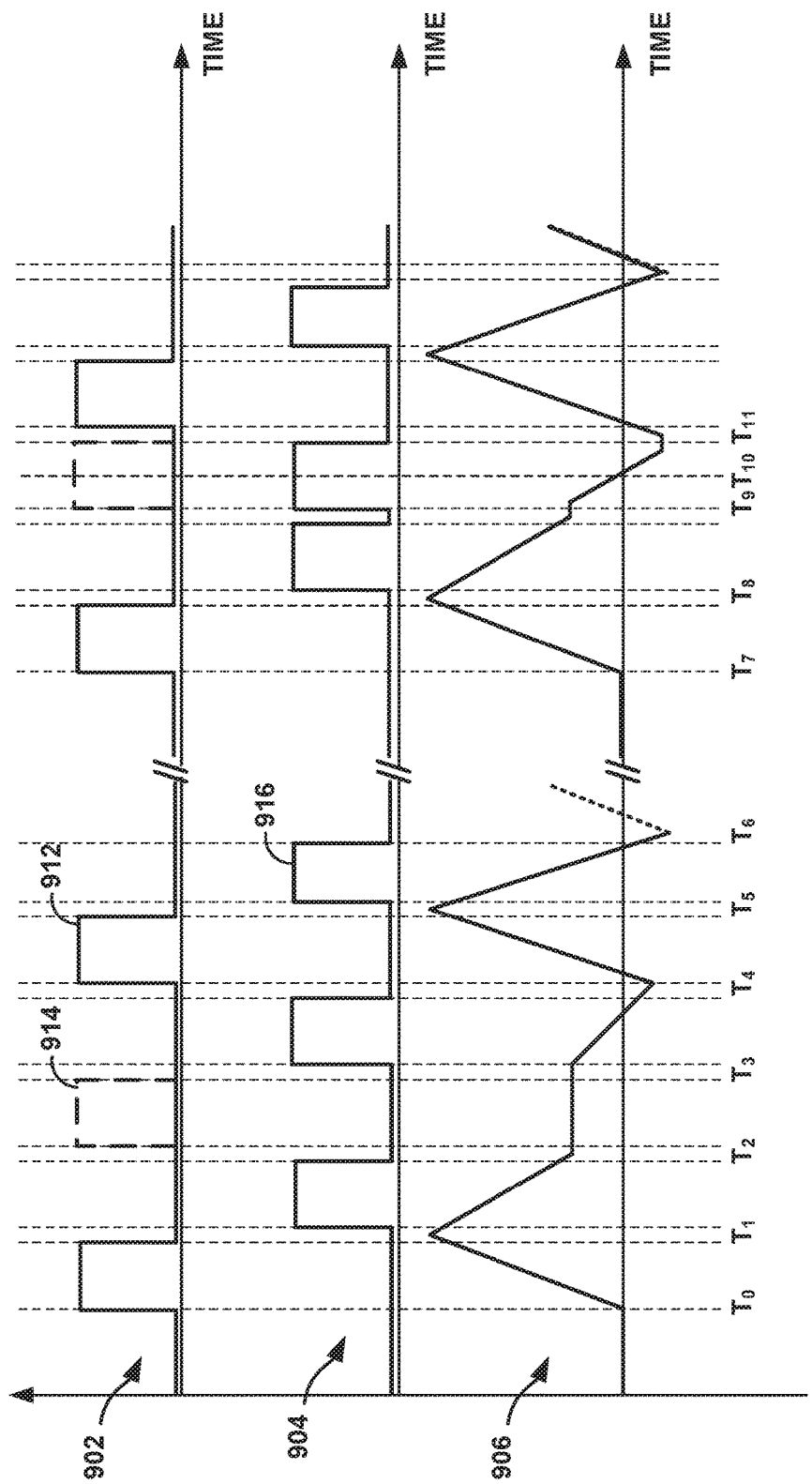
FIGS. 9A and 9B are timing diagrams illustrating additional example electrical characteristics of the example system of FIG. 1 that includes a power circuit configured to protect a power switch from a hard commutation event, in accordance with one or more aspects of the present disclosure
Figure 9B:
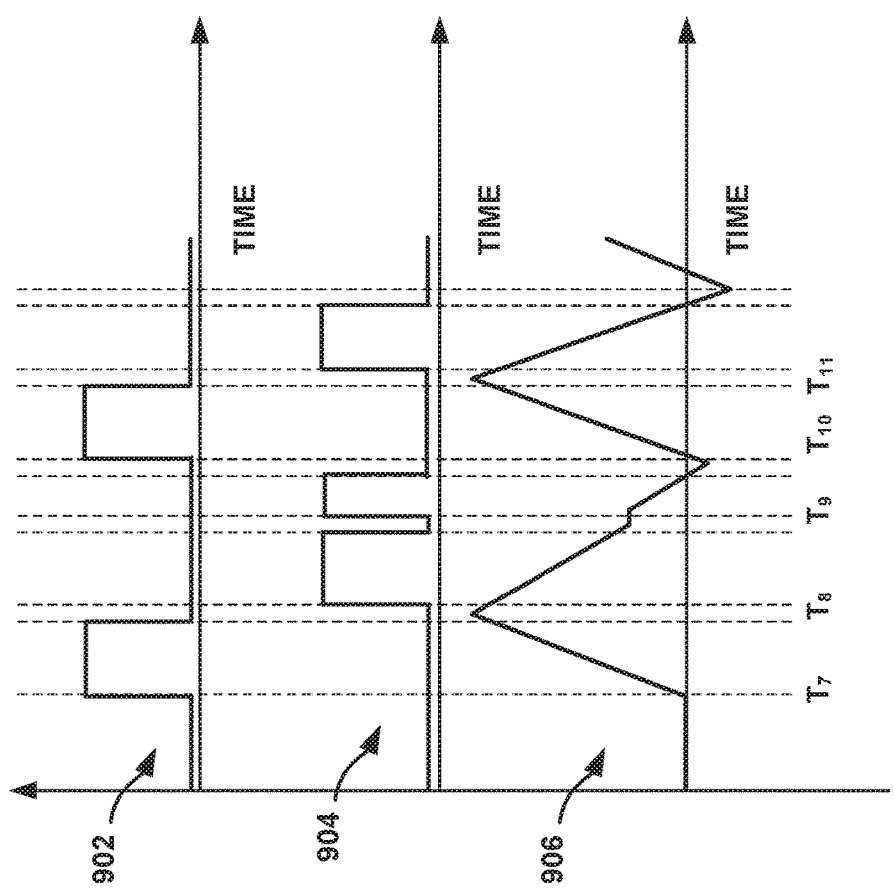

FIGS. 9A and 9B are timing diagrams illustrating additional example voltage and current characteristics of a power switch during a hard commutation event at the power switch, in accordance with one or more aspects of the present disclosure. In particular, FIGS. 9A and 9B show how the techniques described herein may help a power circuit to either avoid a hard commutation event or to reduce the effects that a hard commutation event may have on a power circuit. FIGS. 9A and 9B show, as a function of time, gate voltage (902) of switch 24, gate voltage (904) of switch 25, and current (906) through resonant capacitor 26.

As shown in FIG. 9A, the imminent threat of a hard commutation event may be detected at time T2 when after the end of the first gate pulse (904) of switch 25 the current (906) has not yet changed polarity. This implies that instead of flowing across the body diode of switch 24 the current (906) is still flowing through body diode of switch 25. Therefore, switching-on switch 24 at time T2 would most likely result in a hard commutation event at switch 25. Therefore, system 1 may deploy various countermeasures as described above to prevent the hard commutation or at least minimize its effects.

In some examples, driver 23 may enable high-ohmic output 35 so that switch 25 is being driven with a high-impedance after first being switched-off with a low-impedance from low-ohmic output 37. By switching-off power switch 25 with low-ohmic output 37 enabled, and then maintaining switch 25 in the switched-off state with high-ohmic output 35 enabled, driver 23 may help switch 25 to survive the hard commutation event by allowing a dv/dt triggered re-turn on of its channel.

In some examples, driver 22 may switch-on switch 24 slowly by using high-ohmic output 34. By enabling high-ohmic output 34 while switching-on switch 24, driver 22 slow down switch 24 when initiating the hard commutation event. Therefore, the current rate of change di/dt may be lower and the voltage overshoot across switch 25 will be lower as well.

In some examples, as shown between times T2 and T3, system 1 may inhibit gate voltage 902 to prevent switch 24 from switching on. By inhibiting the switch-on of power switch 24, system 1 may allow current which momentarily flows still through the body diode of switch 25, to continue to freewheel. Between times T3 and T4, switch 25 switches on in parallel to its already conducting body diode (zero voltage turn-on). The switch-on between times T3 and T4 is safe. Current (906) through resonant capacitor now changes direction and system 1 can resume normal operation. In this way, these techniques have prevented a hard commutation event entirely.

In some examples, as shown between times T9 and T10, system 1 may switch-on an "opposite" switch as a way to avoid a hard commutation event. For instance, at time T9, a potential hard commutation may be detected and system 1 may try to prevent the hard commutation event from occurring, by switching-on power switch 25, instead of turning on switch 24. In other words, system 1 may "double pulse" power switch 25 to force current (906) to change direction. Switching-on power switch 25 at time T9 is again safe as the current is already flowing through the body diode of switch 25 (e.g., zero voltage switching). Current (906) through resonant capacitor 26 changes direction at time T10 and system 1 returns to normal operation. Again, in this way, these techniques have prevented a hard commutation event entirely. FIG. 9A shows that system 1 may wait until time T11, after the second pulse of the double pulse (904) finishes, before causing power switch 24 to switch on. By waiting for the second pulse (904) to finish, system 1 may cause a half a cycle phase shift in gate signal (902) from time T11 and beyond, as compared to times prior.

Alternatively, FIG. 9B shows that system 1 may switch-on power switch 24 as soon as current (906) changes polarity. That is, rather than cause gate signal (902) delay any longer than is necessary to safely turn-on power switch 24, FIG. 9B shows that system 1 may switch off power switch 25 and switch-on power switch 24 at time T10 and resume normal operations.

The concepts mentioned in this specification, which has been explicitly explained in the context of an LLC converter can be transferred to other topologies such as Synchronous buck, synchronous boost, dual active bridges, phase shift ZVS, flyback converter and the like. Explained thus far are so called "symmetrical solutions" where both switches in a half bridge are controlled permanently, in subsequent time intervals, actively the transfer of power. Besides symmetrical solutions, there are three other areas of interest in which the concepts mentioned so far can be applied.

A first area of interest are topologies using half bridges or full bridges in a non-permanent way to control the transfer of power. One example here is the dual active bridge, which consists of two full bridges both on the primary side and the secondary side of a transformer. Typically this topology is used as bidirectional converter such as coupling a battery to a DC link. Power may be transferred from the DC link to the battery or vice versa. Hence either the primary side switches or the secondary side switches are used to control the power whereas the other switches are used as synchronous rectification element. The claims outlined in this patent are hence to be understood to cover also switches which are non-permanently used to actively control power.

A second area of interest are asymmetric topologies where in contrast to the LLC circuit discussed so far, a first switch is actively controlling the power and a second switch is synchronously rectifying the current flow. Examples include synchronous buck and synchronous boost topologies. In this context one switch is the control FET, the other is the so-called sync FET. If for example this topology is used in normal conditions in a discontinuous current mode or transition mode or triangular current mode the commutation of the sync FET would always occur at zero current or positive current through the forward conducting channel. That is there would be no hard commutation. If the topology however is used in continuous current mode (that is switching on the control FET while the sync FET is still conducting on its body diode) hard commutation events may occur. These hard commutations may be avoided or at least the potential damage may be limited by using the concepts discussed above.

A third area of interest are topologies where the synchronous rectifying element is on the secondary side of a transformer, such as with Flyback. Again in discontinuous current mode, transition mode or triangular current mode there is no hard commutation event. However in continuous current mode hard commutation events may occur. Hard commutations in this case may be avoided or at least the potential damage may be limited by using the concepts discussed above.

Clause 1. A method comprising: driving, with a driver, a power switch to supply power to a load for at least a switching cycle of the power switch, wherein driving the power switch comprises: enabling a high-ohmic output of the driver during at least one portion of a first phase of the switching cycle when the power switch is switched-off; and enabling a low-ohmic output of the driver during both a second phase of the switching cycle when the power switch is switched-on and during any remaining portion of the first phase other than the at least one portion of the first phase when the high-ohmic output is enabled. Ok with the clarification as added in the specification.

Clause 2. The method of clause 1, wherein enabling the high-ohmic output of the driver comprises enabling the high-ohmic output in response to determining that a threshold amount of time has passed since the power switch was last switched-off.

Clause 3. The method of any of clauses 1-2, wherein driving the power switch further comprises determining whether the power switch is switched-off or switched-on, wherein the high-ohmic output is enabled in response to determining that the power switch is switched-off and the low-ohmic output is enabled in response to determining that the power switch is switched-on.

Clause 4. The method of clause 3, wherein a controller or the driver determines whether the power switch is switched-off or switched-on.

Clause 5. The method of any of clauses 1-4, wherein the enabling of the high-ohmic output of the driver protects the power switch during a hard commutation event.

Clause 6. The method of any of clauses 1-5, wherein the enabling of the high-ohmic output configures the power switch to switching-on in a first amount of time and the enabling of the low-ohmic output configures the power switch to switch-on in a second amount of time that is less than the first amount of time.

Clause 7. The method of any of clauses 1-6, wherein enabling the low-ohmic output of the driver enables the power switch to switch-on more quickly than when the high-ohmic output is enabled.

Clause 8. The method of any of clauses 1-7, wherein the high-ohmic output and the low-ohmic output are a single output of the driver that is configurable to have a greater amount of output resistance when the high-ohmic output is enabled and a lesser amount of output resistance when the low-ohmic output is enabled.

Clause 9. The method of any of clauses 1-8, wherein the high-ohmic output and the low-ohmic output are two different and individually selectable outputs of the driver.

Clause 10. A driver of a power switch used to supply power to a load for at least a switching cycle of the power switch, the driver comprising at least one output, wherein the at least one output comprises: a high-ohmic output that is enabled during at least one portion of a first phase of the switching cycle when the power switch is switched-off; and a low-ohmic output that is enabled during a second phase of the switching cycle when the power switch is switched-on and during any remaining portion of the first phase other than the at least one portion of the first phase when the high-ohmic output is enabled.

Clause 11. The driver of clause 10, wherein: the high-ohmic output is configured to provide, when enabled, a gate signal to the power switch with a first amount of impedance; the low-ohmic output is configured to provide, when enabled, the gate signal to the power switch with a second amount of impedance that is less than the first amount of impedance.

Clause 12. The driver of any of clauses 10-11, wherein the driver is configured to determine whether to enable the low-ohmic output or the high-ohmic output based on a driver control signal that the driver receives from a controller.

Clause 13. The driver of any of clauses 10-12, wherein the driver is configured to: enable the low-ohmic output for a threshold amount of time during the first phase of the switching cycle just prior to enabling the high-ohmic output during the at least one portion of the first phase of the switching cycle.

Clause 14. The driver of any of clauses 10-13, wherein: the low-ohmic output and the high-ohmic output each include a respective transistor stage that is configured to electrically couple a gate terminal of the power switch to a positive power supply node of the driver to drive the power switch to a switched-on state or couple the gate terminal of the power switch to a lowest potential power supply node of the driver to drive the power switch to a switched-off state.

Clause 15. The driver of any of clauses 10-14, wherein: the transistor stage of the high-ohmic output has a greater amount of impedance than the transistor stage of the low-ohmic output.

Clause 16. The driver of any of clauses 10-15, wherein the at least one output is a single output electrically coupled to a single output port of the driver.

Clause 17. The driver of any of clauses 10-16, wherein the at least one output comprises: a first output that is configurable as the low-ohmic output, the first output being electrically coupled to a first output port of the driver; and a second output that is configurable as the high-ohmic output, the second output being electrically coupled to a second output port of the driver.

Clause 18. The driver of clause 17, wherein the first output port is configured to couple to a gate terminal of the power switch via a first gate resistor and the second output port is configured to couple to the gate terminal via a second gate resistor.

Clause 19. A system comprising: a half-bridge that includes a first switch coupled to a second switch at a switching node; a first driver configured to drive the first switch; and a second driver configured to drive the second switch by at least: driving the second switch with a high-ohmic output of the second driver during at least one portion of a first phase of the switching cycle of the second switch when the second switch is switched-off; and driving the second switch on with a low-ohmic output of the second driver during a second phase of the switching cycle of the second switch when the second switch is switched-on and any remaining portion of the first phase of the switching cycle of the second switch other than the at least one portion of the first phase of the second switch.

Clause 20. The system of clause 19, wherein the first driver is further configured to drive the first switch by at least: driving the first switch with a high-ohmic output of the first driver during at least one portion of a first phase of a switching cycle of the first switch when the first switch is switched-off, and drive the first switch with a low-ohmic output of the first driver during a second phase of the switching cycle of the first switch when the first switch is switched-on and any remaining portion of the first phase of the switching cycle of the first switch other than the at least one portion of the first phase of the first switch.

Clause 21. The system of any of clauses 19-20, wherein the second driver is further configured to drive the second switch with the low-ohmic output for a threshold amount of time prior to driving the first switch with the high-ohmic output.

Clause 22. The system of any of clauses 19-21, further comprising a controller unit configured to output a driver control signal to the second driver, wherein the second driver is further configured to drive the second switch with the high-ohmic output based on the driver control signal.

Clause 23. The system of any of clauses 19-22, wherein the high-ohmic output of the second driver and the low-ohmic output of the second driver are either a single output port or respective individual output ports.

Clause 24. A system comprising means for performing any of the methods of clauses 1-9.

Clause 25. A driver comprising means for performing any of the methods of clauses 1-9.

Clause 26. A controller unit comprising means for performing any of the methods of clauses 1-9.

Clause 27. A non-transitory computer readable storage unit comprising instructions, that, when executed, configure at least one processor of a system to perform any of the methods of clauses 1-9.

Clause 28. A method comprising: during a current switching cycle of first and second power switches of a half-bridge of a resonant converter, determining whether a hard commutation event is likely to occur at the half-bridge during a future switching cycle of the first and second power switches; responsive to determining that the hard commutation event is likely to occur during the future switching cycle, activating at least one hard commutation countermeasure; and responsive to determining that the hard commutation event will not occur during the future switching cycle, refraining from activating the at least one hard commutation countermeasure.

Clause 29. The method of clause 28, wherein activating the at least one hard commutation countermeasure prevents the hard commutation event or at least protects at least one of the first and second power switches from the hard commutation event.

Clause 30. The method of any of clauses 28-29, wherein determining whether the hard commutation event is likely to occur during the future switching cycle comprises: determining a direction of current flowing between a switching node of the half-bridge and a resonant capacitor of the resonant converter; determining a respective operating state of each of the first and second power switches; determining, based on the direction of the current and the respective operating states of the first and second power switches, whether the first power switch is operating in reverse operation mode by conducting on a respective body diode of the first power switch while the second switch is conducting through a forward conduction channel of the second switch; and responsive to determining that the first power switch is operating in reverse operation mode while the second switch is conducting through the forward conduction channel, determining that the hard commutation event is likely to occur during the future switching cycle.

Clause 31. The method of any of clauses 28-30, wherein determining whether the hard commutation event is likely to occur during the future switching cycle comprises: determining a respective direction of current flowing through each of the first and second power switches; determining, based on the respective directions of the current flowing through each of the first and second power switches, whether the first power switch is operating in reverse operation mode while the second switch is conducting through a forward conduction channel of the second switch; and responsive to determining that the first power switch is operating in reverse operation mode while the second switch is conducting through the forward conduction channel, determining that the hard commutation event is likely to occur during the future switching cycle.

Clause 32. The method of any of clauses 28-31, wherein determining whether the hard commutation event is likely to occur during the future switching cycle comprises: determining a respective voltage across each of the first and second power switches; determining whether the first power switch is operating in reverse operation mode while the second switch is conducting through a forward conduction channel of the second switch based on the respective voltages across each of the first and second power switches; and responsive to determining that the first power switch is operating in reverse operation mode while the second switch is conducting through the forward conduction channel, determining that the hard commutation event is likely to occur during the future switching cycle.

Clause 33. The method of any of clauses 28-32, wherein determining whether the hard commutation event is likely to occur during the future switching cycle comprises: determining a first voltage across one of the first and second power switches; determining a second voltage across a DC link of the half-bridge; determining whether the first power switch is operating in reverse operation mode while the second switch is conducting through a forward conduction channel of the second switch based on the first voltage and the second voltage; and responsive to determining that the first power switch is operating in reverse operation mode while the second switch is conducting through the forward conduction channel, determining that the hard commutation event is likely to occur during the future switching cycle.

Clause 34. The method of any of clauses 28-33, wherein the first power switch is configured to remain switched-off during the future switching cycle, and wherein activating the at least one countermeasure comprises enabling a high-ohmic output of a driver of the first power switch.

Clause 35. The method of any of clauses 28-34, wherein the second power switch is configured to switch-on during the future switching cycle, wherein activating the at least one countermeasure comprises enabling a high-ohmic output of a driver of the second power switch to slow-down the switch-on of the second power switch.

Clause 36. The method of any of clauses 28-35, wherein the second power switch is configured to switch-on during the future switching cycle, wherein activating the at least one countermeasure comprises refraining from switching-on the second power switch during the future switching cycle.

Clause 37. The method of clause 36, wherein activating the at least one countermeasure further comprises switching-on the first power switch during the future switching cycle.

Clause 38. The method of any of clauses 28-37, wherein refraining from activating the at least one hard commutation countermeasure comprises enabling a low-ohmic output of a driver of at least one of the first and second power switches.

Clause 39. The method of any of clauses 28-38, wherein the future switching cycle is a next, subsequent switching cycle that immediately follows the current switching cycle in-time.

Clause 40. A controller unit for a power circuit, the controller unit being configured to: during a current switching cycle of a half-bridge, determine whether a hard commutation event is likely to occur at the half-bridge during a future switching cycle, wherein the half-bridge includes a first switch coupled to a second switch at a switching node; and responsive to determining that the hard commutation event is likely to occur during the future switching cycle, control a first driver and a second driver to activate at least one hard commutation countermeasure, wherein the first driver drives the first switch and the second driver drives the second switch.

Clause 41. The controller unit of clause 40, wherein the controller unit is further configured to: receive, from a measurement unit, an indication of electrical characteristics of the half-bridge being sensed by the measurement unit; and determine whether the hard commutation event is likely to occur at the half-bridge during the future switching cycle based at least in part of the electrical characteristics.

Clause 42. The controller unit of any of clauses 40-41, wherein the controller unit is configured to determine whether the hard commutation event is likely to occur at the half-bridge during the future switching cycle based at least in part on a direction of current flowing between the switching node and a resonant capacitor, and a respective operating state of each of the first and second switches.

Clause 43. The controller unit of any of clauses 40-42, wherein the controller unit is configured to determine whether the hard commutation event is likely to occur at the half-bridge during the future switching cycle based at least in part on a respective direction of current flowing through each of the first and second switches.

Clause 44. The controller unit of any of clauses 40-43, wherein the controller unit is configured to determine whether the hard commutation event is likely to occur at the half-bridge during the future switching cycle based at least in part on a respective voltage across each of the first and second switches.

Clause 45. The controller unit of any of clauses 40-44, wherein the controller unit is configured to determine whether the hard commutation event is likely to occur at the half-bridge during the future switching cycle based at least in part on a first voltage across one of the first and second power switches and a second voltage across a DC link of the half-bridge.

Clause 46. The controller unit of any of clauses 40-45, wherein the controller unit is configured to control the first driver and the second driver to activate the at least one hard commutation countermeasure by enabling at least one of a high-ohmic output of the first driver and a high-ohmic output of the second driver.

Clause 47. The controller unit of any of clauses 40-46, wherein the controller unit is configured to control the first driver and the second driver to activate the at least one hard commutation countermeasure by at least: commanding the first driver to refrain from switching-on the first switch during the future switching cycle while commanding the second driver to maintain the second switch to operate in a switched-off state during the future switching cycle; or commanding the first driver to refrain from switching-on the first switch during the future switching cycle while commanding the second driver to switch-on the second switch during the future switching cycle.

Clause 48. The controller unit of any of clauses 40-47, wherein the future switching cycle is a next, subsequent switching cycle that immediately follows the current switching cycle in-time.

Clause 49. A system comprising: a half-bridge that includes a first switch coupled to a second switch at a switching node; a first driver configured to drive the first switch; a second driver configured to drive the second switch; and a controller unit configured to: determine whether a hard commutation event is likely to occur at the half-bridge during a future switching cycle; and responsive to determining that the hard commutation event is likely to occur during the future switching cycle, control the first driver and the second driver to activate at least one hard commutation countermeasure.

Clause 50. The system of clause 49, wherein the future switching cycle is a next, subsequent switching cycle.

Clause 51. A system comprising means for performing any of the methods of clauses 28-39.

Clause 52. A driver comprising means for performing any of the methods of clauses 28-39.

Clause 53. A controller unit comprising means for performing any of the methods of clauses 28-39.

Clause 54. A non-transitory computer readable storage unit comprising instructions, that, when executed, configure at least one processor of a system to perform any of the methods of clauses 28-39.

The aforementioned examples are used to show examples or applications that are applicable to the techniques and circuits described herein. In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples of the disclosure have been described. These and other examples are within the scope of the following claims.

The invention claimed is:

1. A method comprising:
during a current switching cycle of first and second power switches of a half-bridge of a resonant converter, determining whether a hard commutation event will occur at the half-bridge during a future switching cycle of the first and second power switches by at least:
    determining a direction of current flowing between a switching node of the half-bridge and a resonant capacitor of the resonant converter;
    determining a respective operating state of each of the first and second power switches;
    determining, based on the direction of the current and the respective operating states of the first and second power switches, whether the first power switch is operating in reverse operation mode by conducting on a respective body diode of the first power switch while the second switch is conducting through a forward conduction channel of the second switch; and
    responsive to determining that the first power switch is operating in reverse operation mode while the second switch is conducting through the forward conduction channel, determining that the hard commutation event will occur during the future switching cycle;
responsive to determining that the hard commutation event will occur during the future switching cycle, activating at least one hard commutation countermeasure; and
responsive to determining that the hard commutation event will not occur during the future switching cycle, refraining from activating the at least one hard commutation countermeasure.

2. The method of claim 1, wherein activating the at least one hard commutation countermeasure prevents the hard commutation event or at least protects at least one of the first and second power switches from the hard commutation event.

3. The method of claim 1, wherein determining whether the hard commutation event will occur during the future switching cycle comprises:
determining a respective direction of current flowing through each of the first and second power switches;
determining, based on the respective directions of the current flowing through each of the first and second power switches, whether the first power switch is operating in reverse operation mode while the second switch is conducting through a forward conduction channel of the second switch; and responsive to determining that the first power switch is operating in reverse operation mode while the second switch is conducting through the forward conduction channel, determining that the hard commutation event will occur during the future switching cycle.

4. The method of claim 1, wherein determining whether the hard commutation event will occur during the future switching cycle comprises:

determining a respective voltage across each of the first and second power switches;

determining whether the first power switch is operating in reverse operation mode while the second switch is conducting through a forward conduction channel of the second switch based on the respective voltages across each of the first and second power switches; and responsive to determining that the first power switch is operating in reverse operation mode while the second switch is conducting through the forward conduction channel, determining that the hard commutation event will occur during the future switching cycle.

5. The method of claim 1, wherein determining whether the hard commutation event will occur during the future switching cycle comprises:

determining a first voltage across one of the first and second power switches;

determining a second voltage across a DC link of the half-bridge;

determining whether the first power switch is operating in reverse operation mode while the second switch is conducting through a forward conduction channel of the second switch based on the first voltage and the second voltage; and responsive to determining that the first power switch is operating in reverse operation mode while the second switch is conducting through the forward conduction channel, determining that the hard commutation event will occur during the future switching cycle.

6. The method of claim 1, wherein the first power switch is configured to remain switched-off during the future switching cycle, and wherein activating the at least one countermeasure comprises enabling a high-ohmic output of a driver of the first power switch.

7. The method of claim 1, wherein the second power switch is configured to switch-on during the future switching cycle, wherein activating the at least one countermeasure comprises enabling a high-ohmic output of a driver of the second power switch to slow-down the switch-on of the second power switch.

8. The method of claim 1, wherein the second power switch is configured to switch-on during the future switching cycle, wherein activating the at least one countermeasure comprises refraining from switching-on the second power switch during the future switching cycle.

9. The method of claim 8, wherein activating the at least one countermeasure further comprises switching-on the first power switch during the future switching cycle.

10. The method of claim 1, wherein refraining from activating the at least one hard commutation countermeasure comprises enabling a low-ohmic output of a driver of at least one of the first and second power switches.

11. The method of claim 1, wherein the future switching cycle is a next, subsequent switching cycle that immediately follows the current switching cycle in-time.

12. A controller unit for a power circuit, the controller unit being configured to:

during a current switching cycle of a half-bridge, determine whether a hard commutation event will occur at the half-bridge during a future switching cycle, wherein the half-bridge includes a first switch coupled to a second switch at a switching node, wherein the controller unit is configured to determine whether the hard commutation event will occur at the half-bridge during the future switching cycle based at least in part on a direction of current flowing between the switching node and a resonant capacitor, and a respective operating state of each of the first and second switches; and responsive to determining that the hard commutation event will occur during the future switching cycle, control a first driver and a second driver to activate at least one hard commutation countermeasure, wherein the first driver drives the first switch and the second driver drives the second switch.

13. The controller unit of claim 12, wherein the controller unit is further configured to:

receive, from a measurement unit, an indication of electrical characteristics of the half-bridge being sensed by the measurement unit; and determine whether the hard commutation event will occur at the half-bridge during the future switching cycle based at least in part of the electrical characteristics.

14. The controller unit of claim 12, wherein the controller unit is configured to determine whether the hard commutation event will occur at the half-bridge during the future switching cycle by at least determining whether the hard commutation event will occur during the future switching cycle.

15. The controller unit of claim 12, wherein the controller unit is configured to determine whether the hard commutation event will occur at the half-bridge during the future switching cycle based at least in part on a respective direction of current flowing through each of the first and second switches.

16. A controller unit for a power circuit, the controller unit being configured to:

during a current switching cycle of first and second power switches of a half-bridge of a resonant converter, determine whether to activate a hard commutation countermeasure during a future switching cycle of the first and second power switches by at least:

determining a respective direction of current flowing through each of the first and second power switches;

determining, based on the respective directions of the current flowing through each of the first and second power switches, whether the first power switch is operating in reverse operation mode while the second switch is conducting through a forward conduction channel of the second switch; and responsive to determining that the first power switch is operating in reverse operation mode while the second switch is conducting through the forward conduction channel, determining to activate the hard commutation countermeasure during the future switching cycle;

responsive to determining to activate the hard commutation countermeasure during the future switching cycle, activate at least one hard commutation countermeasure; and responsive to determining to not activate the hard commutation countermeasure during the future switching cycle, refrain from activating the at least one hard commutation countermeasure.

17. The controller unit of claim 16, wherein the controller unit is further configured to activate the at least one hard commutation countermeasure to prevent a hard commutation event from occurring at the half-bridge during the future switching cycle or at least protect at least one of the first and second power switches from the hard commutation event.

18. The controller unit of claim 16, wherein the controller unit is further configured to determine whether to activate the hard commutation countermeasure during the future switching cycle comprises:
- determining a direction of current flowing between a switching node of the half-bridge and a resonant capacitor of the resonant converter;
- determining a respective operating state of each of the first and second power switches;
- determining, based on the direction of the current and the respective operating states of the first and second power switches, whether the first power switch is operating in reverse operation mode by conducting on a respective body diode of the first power switch while the second switch is conducting through a forward conduction channel of the second switch.

* * * * *